United States Patent
Ohta et al.

(10) Patent No.: US 8,044,434 B2
(45) Date of Patent: Oct. 25, 2011

(54) SEMICONDUCTOR DEVICE EMPLOYING GROUP III-V NITRIDE SEMICONDUCTORS AND METHOD FOR MANUFACTURING THE SAME

(75) Inventors: Hiroaki Ohta, Kyoto (JP); Hidemi Takasu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 141 days.

(21) Appl. No.: 12/310,366

(22) PCT Filed: Aug. 22, 2007

(86) PCT No.: PCT/JP2007/066293
§ 371 (c)(1),
(2), (4) Date: Feb. 23, 2009

(87) PCT Pub. No.: WO2008/023737
PCT Pub. Date: Feb. 28, 2008

(65) Prior Publication Data
US 2010/0006894 A1    Jan. 14, 2010

(30) Foreign Application Priority Data
Aug. 24, 2006    (JP) ................................ 2006-228029

(51) Int. Cl.
*H01L 31/0328* (2006.01)
(52) U.S. Cl. ................................ 257/194; 257/E27.014
(58) Field of Classification Search .................. 257/192, 257/194, 76, E27.014, E29.089, E29.246
See application file for complete search history.

(56) References Cited

U.S. PATENT DOCUMENTS

| 6,897,495 B2 | 5/2005 | Yoshida et al. |
| 7,211,839 B2 | 5/2007 | Kachi et al. |
| 7,439,555 B2 | 10/2008 | Beach et al. |
| 2001/0040246 A1* | 11/2001 | Ishii ................................ 257/192 |
| 2005/0127394 A1* | 6/2005 | Nagahama et al. ........... 257/103 |
| 2008/0274621 A1 | 11/2008 | Beach et al. |

FOREIGN PATENT DOCUMENTS

| JP | 04-093038 | 3/1992 |
| JP | 2000-012846 | 1/2000 |
| JP | 2000-091253 | 3/2000 |
| JP | 2003-163354 | 6/2003 |
| JP | 2004-260140 | 9/2004 |
| JP | 2005-175276 | 6/2005 |
| JP | 2005-203753 | 7/2005 |

OTHER PUBLICATIONS

Baker, T.J. et al., Characterization of Planar Semipolar Gallium Nitride Films on Sapphire Substrates, Jpn J Appl Phys Part 2, 2006, vol. 45, No. 4-7, pp. L154-L157.
Satoshi Okubo, "Not Only Shining Any Longer GaN Behind Evolution of Devices", Jun. 5, 2006, Nikkei Electronics, pp. 51-60, which is described on page 2 of English specification.

* cited by examiner

*Primary Examiner* — Thomas L Dickey
(74) *Attorney, Agent, or Firm* — Rabin & Berdo, PC

(57) ABSTRACT

The semiconductor device includes a P-type group III-V nitride semiconductor layer, an N-type group III-V nitride semiconductor layer, and an electrode in contact with both of the P-type group III-V nitride semiconductor layer and the N-type group III-V nitride semiconductor layer. The electrode includes a first electrode portion made of a first conductive material, and a second electrode portion, made of a second conductive material different from the first conductive material, bonded to the first electrode portion. The first electrode portion is in contact with the P-type group III-V nitride semiconductor layer, and the second electrode portion is in contact with the N-type group III-V nitride semiconductor layer.

25 Claims, 10 Drawing Sheets

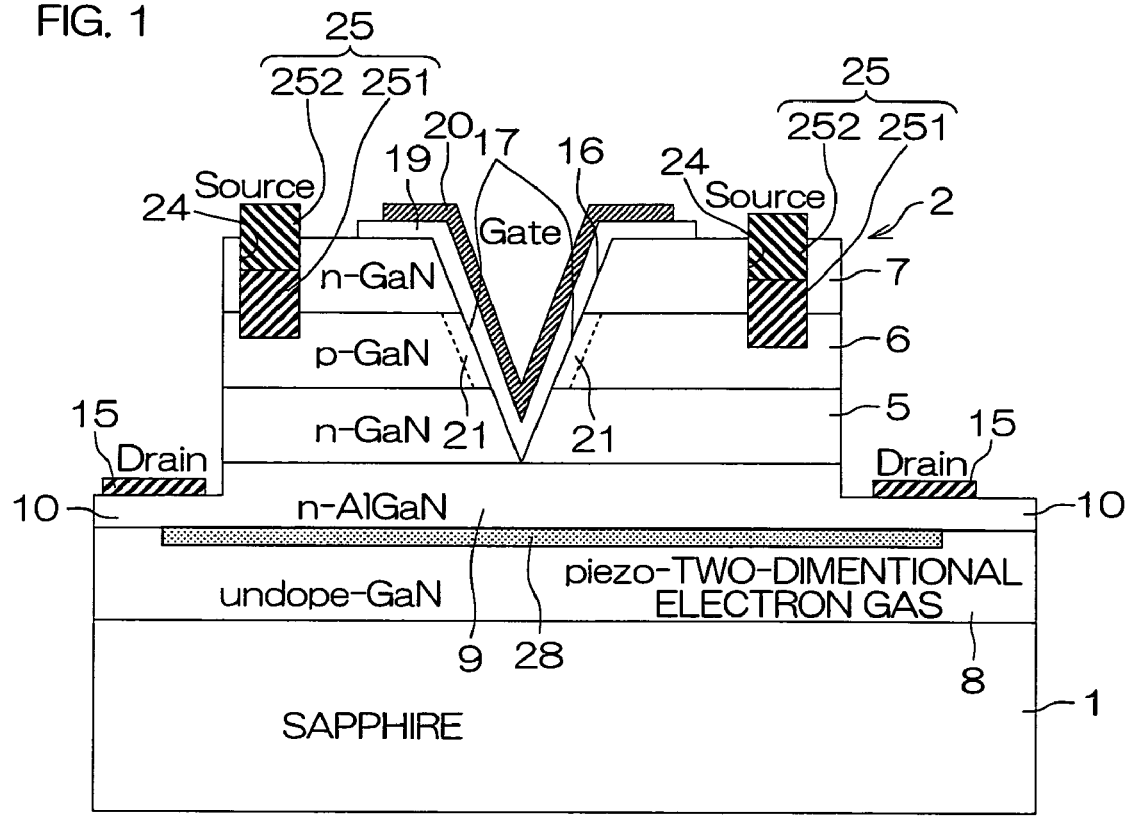

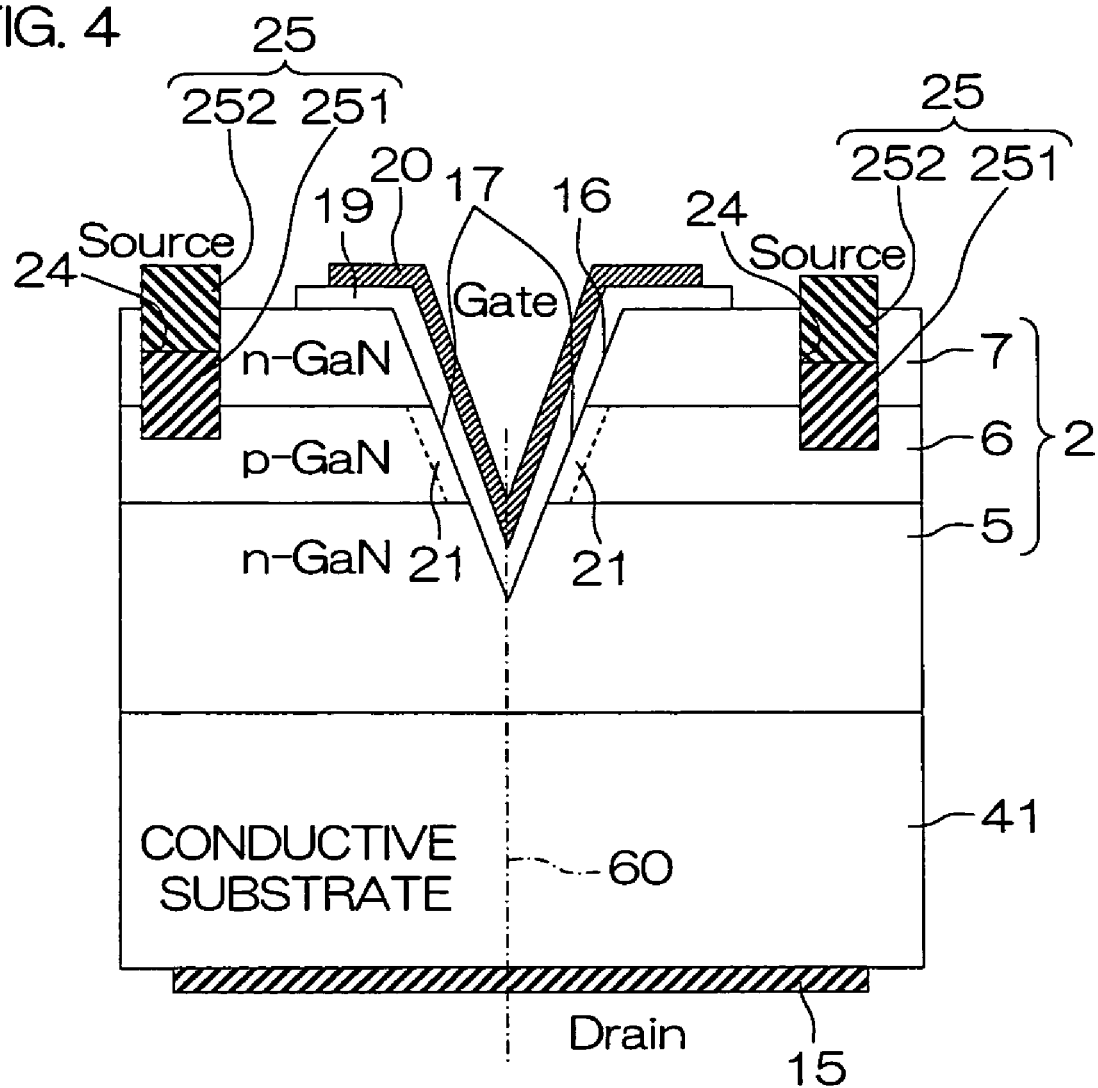

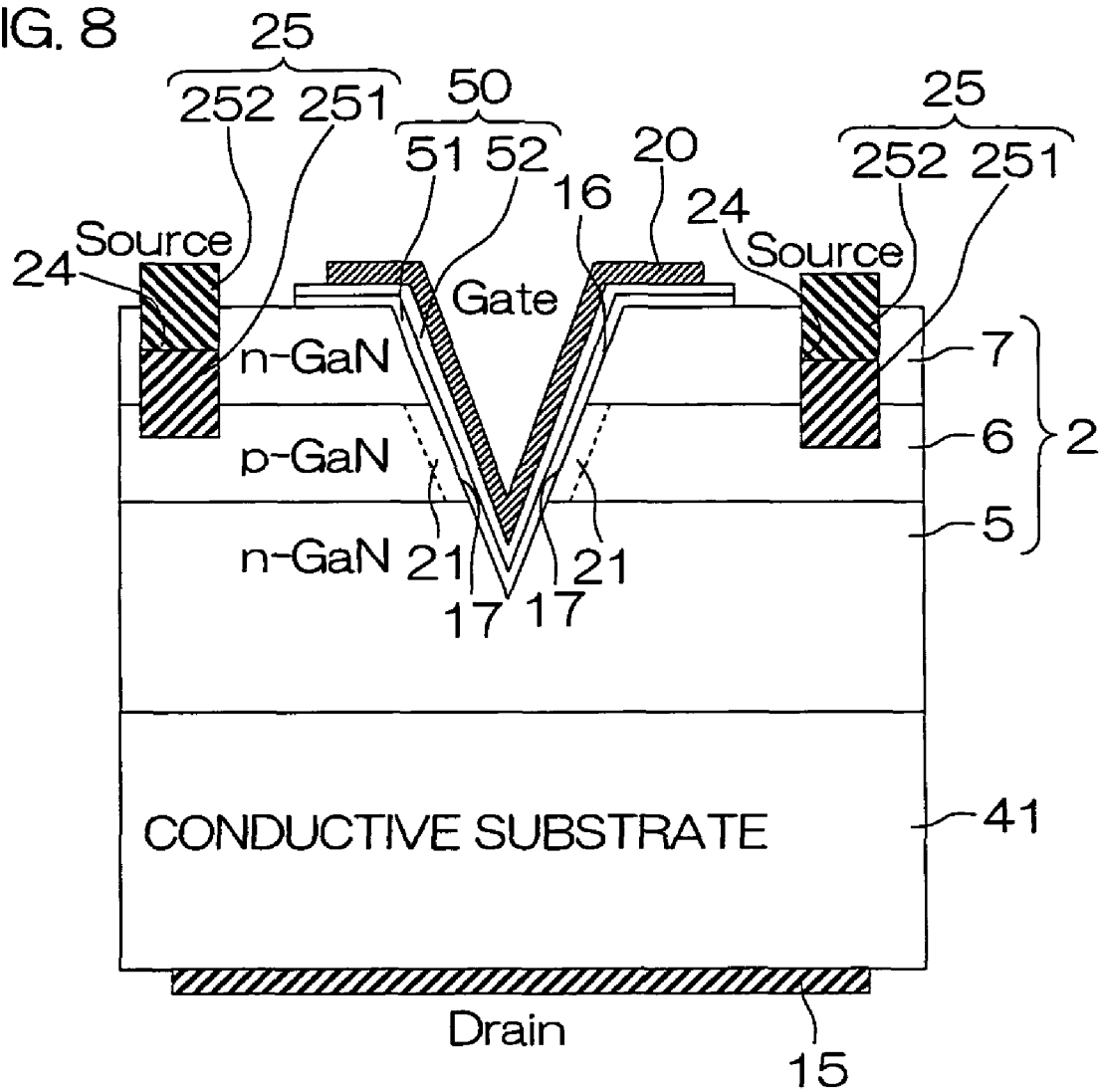

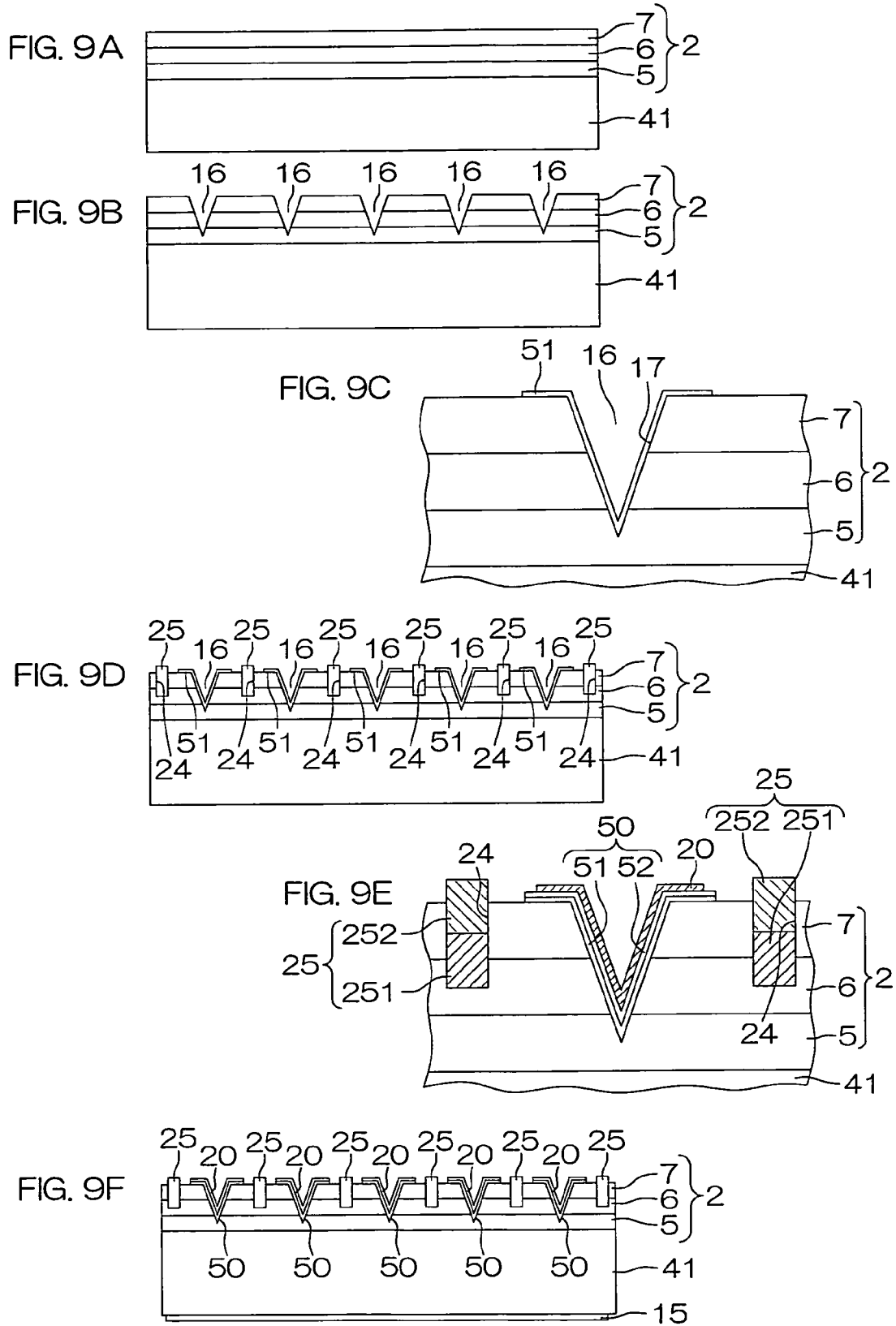

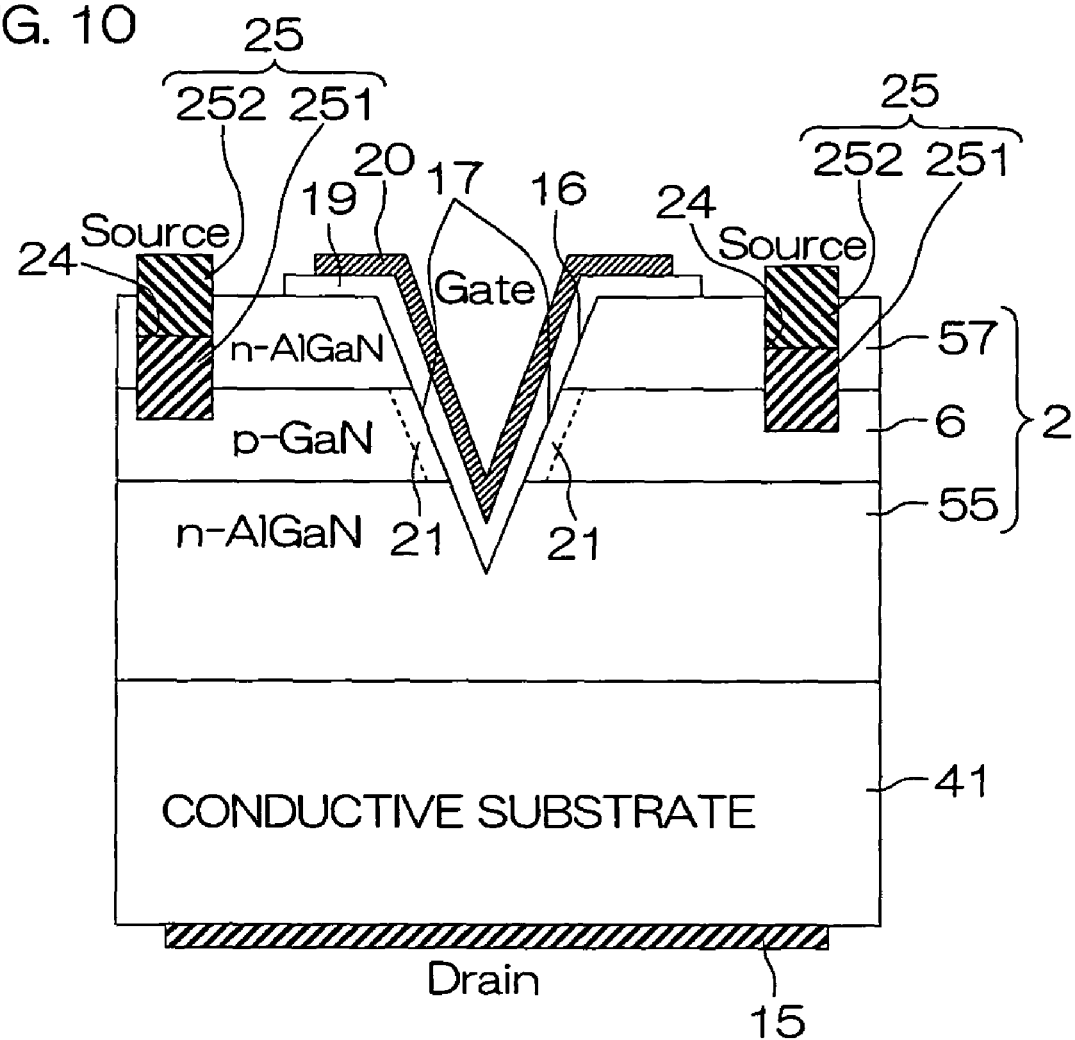

SEMICONDUCTOR DEVICE EMPLOYING GROUP III-V NITRIDE SEMICONDUCTORS AND METHOD FOR MANUFACTURING THE SAME

TECHNICAL FIELD

The present invention relates to a semiconductor device (particularly an MIS field-effect transistor) employing group III-V nitride semiconductors and a method for manufacturing the same.

PRIOR ART

In general, a power device employing a silicon semiconductor is employed for a power amplifier circuit, a power supply circuit, a motor driving circuit or the like.

However, improvement in breakdown voltage, reduction in resistance and improvement in speed of a silicon device are now reaching limits due to the theoretical limit of the silicon semiconductor, and it is becoming difficult to satisfy requirements of the market.

Therefore, development of a GaN device having characteristics such as a high breakdown voltage, a high-temperature operation, a high current density, high-speed switching and small on-resistance is examined (following Non-Patent Document 1).

Patent Document 1: Japanese Unexamined Patent Publication No. 2004-260140
Patent Document 2: Japanese Unexamined Patent Publication No. 2000-91253
Non-Patent Document 1: Satoshi Okubo, "Not Only Shining Any Longer GaN Behind Evolution of Devices", Jun. 5, 2006, Nikkei Electronics, p. 51-60

DISCLOSURE OF THE INVENTION

Problems to be Solved by the Invention

However, every one of heretofore proposed GaN devices has a lateral structure obtained by arranging a source, a gate and a drain along a substrate surface, is not necessarily suitable for a power device requiring a high current, and not sufficient in breakdown voltage either. Further, it is not necessarily easy to implement a normally-off operation which can be regarded as indispensable for a power device.

Therefore, a vertical GaN device may conceivably be constituted. More specifically, a vertical MIS field-effect transistor may conceivably be constituted by stacking an N-type GaN drain layer, a P-type GaN layer and an N-type GaN source layer, forming a trench reaching the N-type GaN drain layer from the N-type GaN source layer, and forming a gate insulating film and a gate electrode on the sidewall of the trench. In this case, a source electrode is preferably brought into contact with the N-type GaN source layer, and also brought into contact with the P-type GaN layer providing a channel layer.

However, it is difficult to select a metallic material forming excellent ohmic contact with both of the P-type GaN layer and the N-type GaN layer, and this causes difficulty in device design.

Needless to say, there is a similar problem not only in the MIS field-effect transistor, but in a semiconductor device having an electrode which must be brought into contact with both of P-type and N-type group III-V nitride semiconductor layers.

Accordingly, an object of the present invention is to provide a semiconductor device (particularly a group III-V nitride semiconductor MIS field-effect transistor) having an electrode excellently brought into contact with both of P-type and N-type group III-V nitride semiconductor layers and a method for manufacturing the same.

Solutions to the Problems

The semiconductor device according to the present invention includes: a P-type group III-V nitride semiconductor layer (6); an N-type group III-V nitride semiconductor layer (7, 57); and an electrode (25) in contact with both of the P-type group III-V nitride semiconductor layer and the N-type group III-V nitride semiconductor layer. The electrode includes a first electrode portion (251) made of a first conductive material and a second electrode portion (252), made of a second conductive material different from the first conductive material, bonded to the first electrode portion. The first electrode portion is in contact (ohmic contact) with the P-type group III-V nitride semiconductor layer, and the second electrode portion is in contact (ohmic contact) with the N-type group III-V nitride semiconductor layer.

While the alphanumeric characters in the parentheses denote corresponding components etc. in embodiments described later, it is not intended that the scope of the present invention is to be interpreted limitedly to the embodiments. This also applies in this section.

According to this structure, the first electrode portion in contact with the P-type group III-V nitride semiconductor layer is constituted of the first conductive material, and the second electrode portion in contact with the N-type group III-V nitride semiconductor layer is constituted of the second conductive material. Therefore, an electrode constituted by bonding the first and second electrode portions to each other can be excellently brought into contact (ohmic contact) with the P-type and N-type group III-V nitride semiconductor layers at the same time by properly selecting the first and second conductive materials.

Preferably, the P-type group III-V nitride semiconductor layer and the N-type group III-V nitride semiconductor layer are stacked, a trench having a sidewall extending over the P-type group III-V nitride semiconductor layer and the N-type group III-V nitride semiconductor layer is formed, and the electrode is embedded in the trench. According to this structure, the electrode can be embedded in the trench, and the first electrode portion can be brought into contact with the P-type group III-V nitride semiconductor layer while the second electrode portion can be brought into contact with the N-type group III-V nitride semiconductor layer on the sidewall of this trench.

Preferably, the first conductive material constituting the first electrode portion is a metallic material containing Pd or Ni. More specifically, the first conductive material can be comprised of a Pd—Au alloy, a Pd—Ti—Au alloy, a Pd—Pt—Au alloy, an Ni—Au alloy or the like.

Preferably, the second conductive material constituting the second electrode portion is a metallic material containing Al. More specifically, the second conductive material can be comprised of an Al metal, or can be comprised of an Al alloy such as a Ti—Al alloy or the like.

An MIS field-effect transistor according to the present invention includes: a nitride semiconductor multilayer structure portion (2) including a first group III-V nitride semiconductor layer (5, 55) of a first conductivity type, a second group III-V nitride semiconductor layer (6) of a second conductivity type stacked on the first group III-V nitride semiconductor layer and a third group III-V nitride semiconductor layer (7, 57) of the first conductivity type stacked on the second group III-V nitride semiconductor layer. Further, the MIS field-effect transistor includes: a gate insulating film (19) formed on a wall surface (17) formed over the first, second and third group III-V nitride semiconductor layers to extend over the first, second and third group III-V nitride semiconductor layers; a gate electrode (20) made of a conductive material formed as being opposed to the second group III-V nitride semiconductor layer (more preferably, the first to third group III-V nitride semiconductor layers) with the gate insulating film interposed therebetween; a drain electrode (15) electrically connected to the first group III-V nitride semiconductor layer; and a source electrode (25) provided as being in contact with both of the second group III-V nitride semiconductor layer and the third group III-V nitride semiconductor layer. The source electrode includes a first electrode portion (251) made of a first conductive material, and a second electrode portion (252), made of a second conductive material different from the first conductive material, bonded to the first electrode portion. The first electrode portion is in contact (ohmic contact) with the second group III-V nitride semiconductor layer, and the second electrode portion is in contact (ohmic contact) with the third group III-V nitride semiconductor layer.

According to this structure, the nitride semiconductor multilayer structure portion of an NPN structure or a PNP structure is formed by stacking the first group III-V nitride semiconductor layer, the second group III-V nitride semiconductor layer and the third group III-V nitride semiconductor layer. The gate insulating film is arranged on the wall surface formed over the first to third group III-V nitride semiconductor layers. A portion of the second group III-V nitride semiconductor layer forming the wall surface forms a channel region, and the gate electrode is opposed to the channel region. Further, the drain electrode is provided to be electrically connected to the first group III-V nitride semiconductor layer, and the source electrode is provided to be electrically connected to the third group III-V nitride semiconductor layer. Thus, a vertical MIS (Metal Insulator Semiconductor) field-effect transistor is constituted.

Thus, a normally-off operation, i.e., an operation for setting an OFF-state between the source and the drain when applying no bias to the gate electrode can be easily implemented due to the basic structure as the vertical MIS field-effect transistor. Further, a high current can be easily fed due to the vertical structure, while a high breakdown voltage can be so ensured that an effective power device can be provided. Needless to say, the field-effect transistor is constituted of the group III-V nitride semiconductor layers, whereby the same can attain characteristics such as a high breakdown voltage, a high-temperature operation, a high current density, high-speed switching and small on-resistance as compared with a device employing a silicon semiconductor. In particular, the MIS field-effect transistor is capable of an operation with a high breakdown voltage and low loss, whereby an excellent power device can be implemented.

The first electrode portion in contact with the second group III-V nitride semiconductor layer of the second conductivity type is constituted of the first conductive material and the second electrode portion in contact with the third group III-V nitride semiconductor layer of the first conductivity type is constituted of the second conductive material, whereby the source electrode can be excellently brought into contact (ohmic contact) with the second and third group III-V nitride semiconductor layers of different conductivity types at the same time by properly selecting the first and second conductive materials.

The group III-V nitride semiconductors are semiconductors employing nitrogen as a group V element in group III-V semiconductors, and aluminum nitride (AlN), gallium nitride (GaN) and indium nitride (InN) are typical examples. The same can be generally expressed as $Al_xIn_yGa_{1-x-y}N$ ($0 \leq x \leq 1$, $0 \leq y \leq 1$ and $0 \leq x+y \leq 1$).

An operation in a case of constituting an N-channel MIS field-effect transistor by setting the first group III-V nitride semiconductor layer and the third group III-V nitride semiconductor layer to N-types and setting the second group III-V nitride semiconductor layer to a P-type, for example, is described. In this case, a bias positive on the drain side is supplied between the source and the drain. At this time, it follows that a reverse voltage is applied to the P-N junction portion on the interface between the first and second group III-V nitride semiconductor layers, and hence the source and the drain are cut off. When applying a bias voltage positive with respect to the second group III-V nitride semiconductor layer to the gate electrode from this state, electrons are induced in a region (channel region) around the wall surface opposed to the gate electrode in the second group III-V nitride semiconductor layer, and an inversion channel is formed. The first and third group III-V nitride semiconductor layers conduct through this inversion channel, and hence it follows that the source and the drain conduct. Thus, the source and the drain conduct when supplying a proper bias to the gate electrode, while the source and the drain are cut off when supplying no bias to the gate electrode. In other words, the normally-off operation is implemented. In a case of constituting a P-channel field-effect transistor by setting the first and third group III-V nitride semiconductor layers to P types and setting the second group III-V nitride semiconductor layer to an N-type, the operation is similar to the above while the polarity of the bias voltage is reversed.

A source electrode trench reaching the second group III-V nitride semiconductor layer from the third group III-V nitride semiconductor layer may be formed, and the source electrode may be embedded in this source electrode trench. According to this structure, the source electrode can be embedded in the source electrode trench, and the first electrode portion can be brought into contact with the second group III-V nitride semiconductor layer while the second electrode portion can be brought into contact with the third group III-V nitride semiconductor layer on the sidewall of this trench.

When the second conductivity type is a P-type, the first conductive material comprising the first electrode portion is preferably a metallic material containing Pd or Ni. More specifically, the first conductive material can be comprised of a Pd—Au alloy, a Pd—Ti—Au alloy, a Pd—Pt—Au alloy, an Ni—Au alloy or the like.

When the first conductivity type is an N-type, the second conductive material constituting the second electrode portion is preferably a metallic material containing Al. More specifically, the second conductive material can be constituted of an Al metal, or can be constituted of an Al alloy such as a Ti—Al alloy or the like.

A trench (16) reaching the first group III-V nitride semiconductor layer from the third group III-V nitride semiconductor layer through the second group III-V nitride semiconductor layer may be formed, and the sidewall of this trench may form the wall surface. According to this structure, the wall surface of the second group III-V nitride semiconductor layer providing a channel region can be exposed by forming the trench on a position different from the source trench in the nitride semiconductor multilayer structure portion.

The trench may be a sectionally V-shaped trench, may be a sectionally U-shaped trench, or may be a sectionally rectangular trench. Further, the trench may be a V-shaped trench (inverted trapezoidal groove) having a planar surface on the bottom portion, or may be a trench having a trapezoidal sectional shape.

The nitride semiconductor multilayer structure portion may further include a fourth group III-V nitride semiconductor layer (9) of the first conductivity type arranged on a side opposite to the second group III-V nitride semiconductor layer with respect to the first group III-V nitride semiconductor layer (may be arranged in contact with the first group III-V nitride semiconductor layer). In this case, the drain electrode may be connected to the fourth group III-V nitride semiconductor layer.

According to this structure, the drain electrode is connected to the fourth group III-V nitride semiconductor layer formed in contact with the first group III-V nitride semiconductor layer, whereby the drain electrode can be electrically connected to the first group III-V nitride semiconductor layer through this fourth group III-V nitride semiconductor layer. Even if the nitride semiconductor multilayer structure portion is provided on an insulating substrate, the electrical connection between the drain electrode and the first group III-V nitride semiconductor layer can be attained through the fourth group III-V nitride semiconductor layer.

The nitride semiconductor multilayer structure portion may be arranged on a side opposite to the second group III-V nitride semiconductor layer with respect to the first group III-V nitride semiconductor layer (may be arranged in contact with the first group III-V nitride semiconductor layer). In this case, the nitride semiconductor multilayer structure portion preferably further includes a fourth group III-V nitride semiconductor layer (9) of the first conductivity type containing Al.

According to this structure, the fourth group III-V nitride semiconductor layer of the same conductivity type as the first group III-V nitride semiconductor is provided to be in stacking relation with this first group III-V nitride semiconductor layer. This fourth group III-V nitride semiconductor layer contributes to improvement of the breakdown voltage and reduction in resistance.

In this case, the drain electrode may be connected to (in contact with) the fourth group III-V nitride semiconductor layer.

According to this structure, the drain electrode can be electrically connected to the first group III-V nitride semiconductor layer through the fourth group III-V nitride semiconductor layer. When the nitride semiconductor multilayer structure portion is arranged on a substrate, connection of the drain electrode can be performed through the fourth group III-V nitride semiconductor layer even if this substrate is an insulating substrate.

Preferably, the nitride semiconductor multilayer structure portion further includes a fifth group III-V nitride semiconductor layer (8) which is an intrinsic semiconductor layer (undoped) arranged on (preferably arranged in contact with) the fourth group III-V nitride semiconductor layer on a side opposite to the first group III-V nitride semiconductor layer.

In this structure, the fourth group III-V nitride semiconductor layer and the fifth group III-V nitride semiconductor layer consisting of the intrinsic semiconductor layer are arranged in stacking relation. Around the boundary between these fourth and fifth group III-V nitride semiconductor layers, two-dimensional electron gas (28) of a high concentration is formed in the fifth group III-V nitride semiconductor layer. The resistance value of a portion reaching the drain electrode from the first group III-V nitride semiconductor layer can be reduced by utilizing this two-dimensional electron gas, and further reduction in resistance can be attained. Particularly, also in a case of drawing the drain in the lateral direction of the nitride semiconductor multilayer structure portion through the fourth group III-V nitride semiconductor layer, for example, a current flowing between the same and the two-dimensional electron gas can be dispersed in a wide range of the first group III-V nitride semiconductor layer. Thus, concentration of the current can be suppressed, and reduction in resistance of the device is implemented.

Preferably, the fifth group III-V nitride semiconductor layer is a layer doped with Mg, C or Fe. The nitride semiconductor tends to be slightly N-typed in formation (epitaxy) thereof, and hence the fifth group III-V nitride semiconductor layer can be formed by the intrinsic semiconductor layer by doping the same with Mg, C or Fe as the P-type dopant in order to cancel this.

The nitride semiconductor multilayer structure portion may be formed (grown) on a substrate (1, 41).

The substrate may be an insulating substrate (1). A typical insulating substrate is a sapphire ($Al_2O_3$) substrate. Also in a case of employing such an insulating substrate, the aforementioned structure can be employed, or the transistor can be brought into a structure directly bringing the drain electrode into contact with the first group III-V nitride semiconductor layer. Thus, the drain electrode can be electrically connected to the first group III-V nitride semiconductor layer.

The substrate may be an $Al_2O_3$ substrate, a ZnO substrate, an Si substrate, a GaAs substrate, a GaN substrate or an SiC substrate. The GaN substrate is the best in view of the matching property of the lattice constant with the nitride semiconductor structure portion, and nitride semiconductor layers having small numbers of dislocations can be formed by employing the GaN substrate. The $Al_2O_3$ substrate (sapphire substrate) is preferably employed in view of reduction in cost, while the SiC substrate may be employed when attaching importance to heat radiation (heat conductivity).

The substrate may be a substrate having a region exhibiting a high dislocation density and a region exhibiting a small dislocation density in a direction along the substrate surface. In this case, the gate electrode is preferably arranged to be opposed to a region grown from the region exhibiting a low dislocation density.

In a substrate having an epitaxial growth layer formed by epitaxial lateral overgrowth (ELO) as described in Patent Document 2, for example, a region (dislocation-free region) exhibiting a low dislocation density and a region exhibiting a high dislocation density are present in the epitaxial growth layer. When the channel region (region opposed to the wall surface) of the second group III-V nitride semiconductor layer is positioned on a region grown from the region exhibiting a low dislocation density in this case, the dislocation density of the channel region can be so lowers that a leakage current can be suppressed.

The nitride semiconductor multilayer structure portion may be arranged on one surface of a conductive substrate (41), and the drain electrode may be connected to (in contact with) the other surface of the conductive substrate.

According to this structure, the nitride semiconductor multilayer structure portion is arranged on one surface of the conductive substrate, and the drain electrode is so connected to the other surface of the conductive substrate that this drain electrode is electrically connected to the first group III-V nitride semiconductor layer. Thus, the current flows through a wide range of the nitride semiconductor multilayer structure portion, whereby current narrowing can be suppressed, while a high breakdown voltage can be attained at the same time.

A ZnO substrate, an Si substrate, a GaAs substrate, a GaN substrate or an SiC substrate can be applied as the conductive substrate. In particular, the lattice constant of the GaN substrate matches with that of the nitride semiconductor multilayer structure portion, whereby crystallinity of the nitride semiconductor multilayer structure portion can be improved by employing the GaN substrate.

Preferably, the drain electrode is connected to (in contact with) the first group III-V nitride semiconductor layer. According to this structure, the drain electrode can be electrically connected to the first group III-V nitride semiconductor layer.

The drain electrode may be formed in contact with a surface of the nitride semiconductor multilayer structure portion opposite to the gate electrode.

According to this structure, the drain electrode is formed in contact with the surface of the nitride semiconductor multilayer structure portion opposite to the gate electrode, and hence the substrate can be omitted. More specifically, the drain electrode may formed in contact with a surface of the first group III-V nitride semiconductor layer opposite to the second first group III-V nitride semiconductor layer. According to this structure, an MIS field-effect transistor having a thickness or not more than 30 μm can be implemented, for example.

The first group III-V nitride semiconductor layer may have a larger band gap than the second group III-V nitride semiconductor layer. According to this structure, the breakdown voltage can be further improved due to the large band gap of the first group III-V nitride semiconductor layer.

More specifically, the first group III-V nitride semiconductor layer preferably contains Al. Further specifically, the first group III-V nitride semiconductor layer preferably contains not less than 5 weight % of Al.

The third group III-V nitride semiconductor layer may have a larger band gap than the second group III-V nitride semiconductor layer. According to this structure, the band gap of the third group III-V nitride semiconductor layer is enlarged, whereby improvement of the breakdown voltage can be attained. In particular, improvement of the breakdown voltage can be more effectively attained by forming a double heterojunction by rendering the band gaps of both of the first and third group III-V nitride semiconductor layers larger than the band gap of the second group III-V nitride semiconductor layer.

More specifically, the third group III-V nitride semiconductor layer preferably contains Al. Further specifically, the third group III-V nitride semiconductor layer contains not less than 5 weight % of Al.

The first, second and third group III-V nitride semiconductor layers maybe stacked with major surfaces defined by C-planes (0001).

The first, second and third group III-V nitride semiconductor layers may be stacked with major surfaces defined by nonpolar planes (m-planes (10-10) or a-planes (11-20)) or semipolar planes ((10-1-1), (10-1-3), (11-22) or the like).

Preferably, the wall surface of the first, second and third group III-V nitride semiconductor layers on which the gate insulating film is formed is defined by a nonpolar plane (an m-plane (10-10) or an a-plane (11-20)) or a semipolar plane ((10-1-1), (10-1-3), (11-22) or the like).

The gate insulating film may be a nitride or an oxide. In particular, the gate insulating film is preferably made of silicon nitride or silicon oxide.

The gate insulating film may include a group III-V nitride intrinsic semiconductor gate layer (51: regrowth layer) containing Al (preferably containing no In). According to this structure, the group III-V nitride intrinsic semiconductor gate layer containing Al forms an excellent interface between the same and the wall surface of the first to third group III-V nitride semiconductor layers. Therefore, such inconveniences that the carrier mobility in the channel region lowers and the reliability of the device lowers due to an unstable interface can be avoided dissimilarly to a case of forming an insulating film such as an oxide film in contact with the wall surface of the first to third group III-V nitride semiconductor layers.

The gate insulating film may include another insulating film (52) stacked on the group III-V nitride intrinsic semiconductor gate layer containing Al. In this case, the other insulating film is preferably stacked on the group III-V nitride intrinsic semiconductor gate layer on a side opposite to the wall surface. According to this structure, a gate leakage current can be reduced. The group III-V nitride intrinsic semiconductor gate layer containing Al may be insufficient in insulating property if the Al composition is small. In this case, the insufficient insulating property of the group III-V nitride intrinsic semiconductor gate layer containing Al is preferably compensated with the other insulating film.

Preferably, the Al composition in the group III-V nitride intrinsic semiconductor gate layer containing Al is 50 to 100 weight % (not less than 50 weight % and less than 100 weight %). Thus, a necessary insulating property can be ensured.

Preferably, the conductive material constituting the gate electrode consists of a simple metal or an alloy containing at least any one of Al, Au and Pt. The conductive material constituting the gate electrode may contain polysilicon.

Further, the material constituting the source electrode or the drain electrode may contain Mo or an Mo compound, Ti or a Ti compound, or W or a W compound.

Preferably, the drain electrode is made of a material containing at least Al. More specifically, the drain electrode is preferably made of an alloy material containing at least Ti and Al. Thus, contact for wiring can be excellently attained with respect to the drain electrode.

A method for manufacturing a semiconductor device according to one aspect of the present invention includes: a step of forming a P-type group III-V nitride semiconductor layer (6); a step of forming an N-type group III-V nitride semiconductor layer (7, 57); and an electrode forming step of forming an electrode (25) in contact with both of the P-type group III-V nitride semiconductor layer and the N-type group III-V nitride semiconductor layer. The electrode forming step includes a step of forming a first electrode portion (251) made of a first conductive material to be in contact (ohmic contact) with the P-type group III-V nitride semiconductor layer and a step of forming a second electrode portion (252), made of a second conductive material different from the first conductive material, bonded to the first electrode portion to be in contact (ohmic contact) with the N-type group III-V nitride semiconductor layer.

A method for manufacturing an MIS field-effect transistor according to another aspect of the present invention includes: a step of forming a first group III-V nitride semiconductor layer (5, 55) of a first conductivity type on a substrate (1, 41, 45); a step of stacking and forming a second group III-V nitride semiconductor layer (6) of a second conductivity type on this first group III-V nitride semiconductor layer; a step of stacking and forming a third group III-V nitride semiconductor layer (7, 57) of the first conductivity type on this second group III-V nitride semiconductor layer; a wall surface forming step of forming a wall surface (17) extending over the first, second and third group III-V nitride semiconductor layers; a gate insulating film forming step of forming a gate insulating film (19) on the wall surface to extend over the first, second and third group III-V nitride semiconductor layers; a step of forming a gate electrode (20) made of a conductive material to be opposed to the second group III-V nitride semiconductor layer with the gate insulating film interposed therebetween; a step of forming a drain electrode (15) to be electrically connected to the first group III-V nitride semiconductor layer; and a source electrode forming step of forming a source electrode (25) to be in contact with both of the second group III-V nitride semiconductor layer and the third group III-V nitride semiconductor layer. The source electrode forming step includes a step of forming a first electrode portion (251) made of a first conductive material to be in contact (ohmic contact) with the second group III-V nitride semiconductor layer, and a step of forming a second electrode portion (252), made of a second conductive material different from the first conductive material, bonded to the first electrode portion to be in contact (ohmic contact) with the third group III-V nitride semiconductor layer.

This method may further include a step of forming a source electrode trench (24) reaching the second group III-V nitride semiconductor from the third group III-V nitride semiconductor layer, and the source electrode forming step may include a step of embedding the first electrode portion in the source electrode trench, and a step of embedding the second electrode portion in the source electrode trench from above the first electrode portion.

The foregoing and other objects, features and effects of the present invention will become more apparent from the following detailed description of the embodiments with reference to the attached drawings.

BRIEF DESCRIPTION OF THE DRAWINGS

[FIG. 1] A schematic sectional view for illustrating the structure of an MIS field-effect transistor according to a first embodiment of the present invention.

[FIG. 2]

[FIG. 3]

[FIG. 4] A schematic sectional view for illustrating the structure of an MIS field-effect transistor according to a second embodiment of the present invention.

[FIG. 5]

[FIG. 7]

[FIG. 8] A schematic sectional view for illustrating the structure of an MIS field-effect transistor according to a fourth embodiment of the present invention.

[FIG. 9] FIGS. 9A to 9F are schematic sectional views showing a method for manufacturing the MIS field-effect transistor of FIG. 8 in step order.

[FIG. 10] A schematic sectional view for illustrating the structure of an MIS field-effect transistor according to a fifth embodiment of the present invention.

DESCRIPTION OF THE REFERENCE NUMERALS

Figure 2A:
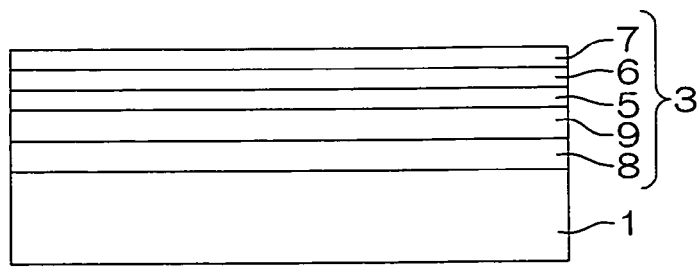
FIGS. 2A to 2E are schematic sectional views showing a method for manufacturing the MIS field-effect transistor of FIG. 1 in step order.

1 . . . sapphire substrate, 2 . . . nitride semiconductor multilayer structure portion, 5 . . . N-type GaN layer, 6 . . . P-type GaN layer, 7 . . . N-type GaN layer, 8 . . . intrinsic GaN layer, 9 . . . N-type AlGaN layer, 10 . . . drawn portion, 15 . . . drain electrode, 16 . . . trench, 17 . . . wall surface, 19 . . . gate insulating film, 20 . . . gate electrode, 21 . . . channel region, 24 . . . source electrode trench, 25 . . . source electrode, 251 . . . first electrode portion, 252 . . . second electrode portion, 28 . . . two-dimensional electron gas, 30 . . . groove, 41 . . . conductive substrate, 45 . . . substrate, 50 . . . gate insulating film, 51 . . . AlGaN regrowth layer, 52 . . . insulating film, 55 . . . N-type AlGaN layer, 57 . . . N-type AlGaN layer

BEST MODE FOR CARRYING OUT THE INVENTION

FIG. 1 is a schematic sectional view for illustrating the structure of an MIS field-effect transistor according to a first embodiment of the present invention. This field-effect transistor includes a sapphire substrate 1 which is an insulating substrate and a nitride semiconductor multilayer structure portion 2 consisting of GaN compound semiconductor layers grown on this sapphire substrate 1. The nitride semiconductor multilayer structure portion 2 includes an N-type GaN layer 5 (drain layer), a P-type GaN layer 6 stacked on this N-type GaN layer 5 and an N-type GaN layer 7 (source layer) stacked on this P-type GaN layer 6. Further, the nitride semiconductor multilayer structure portion 2 includes an intrinsic (undoped) GaN layer 8 formed in contact with the sapphire substrate 1 and an N-type AlGaN layer 9 stacked on this intrinsic GaN layer 8, and the N-type GaN layer 5 is stacked on this N-type AlGaN layer 9.

The nitride semiconductor multilayer structure portion 2 is etched up to such a depth that the N-type AlGaN layer 9 is exposed from the N-type GaN layer 7 so that the section is generally rectangular. The N-type AlGaN layer 9 has drawn portions 10 drawn from both sides of the nitride semiconductor multilayer structure portion 2 in a lateral direction along the surface of the sapphire substrate 1. Drain electrodes 15 are formed in contact with the surfaces of these drawn portions 10. In other words, the drawn portions 10 laterally drawn from the nitride semiconductor multilayer structure portion 2 are constituted of extensions of the N-type AlGaN layer 9 in this embodiment.

On the other hand, a trench 16 having a depth reaching an intermediate portion of the N-type GaN layer 5 from the N-type GaN layer 7 through the P-type GaN layer 6 is formed in the vicinity of a width-directional intermediate portion of the nitride semiconductor multilayer structure portion 2. According to this embodiment, the trench 16 is formed in a sectionally V-shaped manner, and inclined side surfaces thereof form wall surfaces 17 extending over the N-type GaN layer 5, the P-type GaN layer 6 and the N-type GaN layer 7. A gate insulating film 19 is formed on a region covering the overall regions of these wall surfaces 17 and reaching edge portions of the trench 16 on the upper surface of the N-type GaN layer 7. Further, a gate electrode 20 is formed on this gate insulating film 19. In other words, the gate electrode 20 is opposed to the wall surfaces 17, i.e., the N-type GaN layer 5, the P-type GaN layer 6 and the N-type GaN layer 7 through the gate insulating film 19, and further formed to extend up to portions around the edge portions of the trench 16 on the upper surface of the N-type GaN layer 7.

Regions around the wall surfaces 17 in the P-type GaN layer 6 are channel regions 21 opposed to the gate electrode 20. A proper bias voltage is so applied to the gate electrode 20 that inversion channels electrically conducting the N-type GaN layers 5 and 7 are formed in these channel regions 21.

In the nitride semiconductor multilayer structure portion 2, source electrode trenches 24 are formed on positions different from the trench 16. According to this embodiment, a pair of source electrode trenches 24 are formed on both sides of the trench 16. The source electrode trenches 24 are formed up to a depth reaching the P-type GaN layer 6 from the surface of the N-type GaN layer 7. Source electrodes 25 are embedded in these source electrode trenches 24. Therefore, it follows that the source electrodes 25 are electrically connected to both of the N-type GaN layer 7 and the P-type GaN layer 6.

The source electrodes 25 are constituted by bonding first electrode portions 251 embedded in the bottom portions of the source electrode trenches 24 and second electrode portions 252 embedded on these first electrode portions 251 to one another. According to this embodiment, the first electrode portions 251 are embedded up to the height of a layer-thickness intermediate portion of the N-type GaN layer 7 from the bottom surfaces of the source electrode trenches 24 beyond the interface between the P-type GaN layer 6 and the N-type GaN layer 7, and in ohmic contact with the P-type GaN layer 6 on the inner wall surfaces (bottom surfaces and sidewalls) of the source electrode trenches 24. According to this embodiment, the second electrode portions 252 fill up the source trenches 24 from the layer-thickness intermediate portion of the N-type GaN layer 7, and are provided a state protruding beyond the upper surface of the N-type GaN layer 7. The second electrode portions 252 are in ohmic contact with the N-type GaN layer 7 on the inner wall surfaces (sidewalls) of the source electrode trenches 24. Further, the top faces of the first electrode portions 251 and the bottom surfaces of the second electrode portions 252 are bonded to one another, whereby the first and second electrode portions 251 are integrated, and electrically connected with one another.

The first electrode portions 251 in ohmic contact with the P-type GaN layer 6 are constituted of a metallic material containing Pd or Ni. More specifically, the first electrode portions 251 can be constituted of a Pd—Au alloy, a Pd—Ti—Au alloy, a Pd—Pt—Au alloy, an Ni—Au alloy or the like. The second electrode portions 252 in ohmic contact with the N-type GaN layer 7 are constituted of a metallic material containing Al. More specifically, the second electrode portions 252 can be constituted of an Al metal, or can be constituted of an Al alloy such as a Ti—Al alloy or the like.

Two-dimensional electron gas 28 is generated in the intrinsic GaN layer 8 in the vicinity of the interface between the intrinsic GaN layer 8 and the N-type AlGaN layer 9, due to a piezoelectric effect.

The intrinsic GaN layer 8 is formed on the sapphire substrate 1 by the so-called epitaxial lateral overgrowth (ELO), and has a region exhibiting a high dislocation density and regions (dislocation-free regions) exhibiting small dislocation densities in the horizontal direction along the substrate surface. The position for forming the trench 16 is so selected that the regions (dislocation-free regions) exhibiting small dislocation densities are positioned immediately under the channel regions 21. The intrinsic GaN layer 8 is so grown on the sapphire substrate 1 that the major surface (surface parallel to the sapphire substrate 1) thereof is defined by a C-plane (0001), for example. In this case, it follows that the N-type AlGaN layer 9, the N-type GaN layer 5, the P-type GaN layer 6 and the N-type GaN layer 7 stacked on the intrinsic GaN layer 8 by epitaxy are stacked also with major surfaces defined by C-planes (0001). The wall surfaces of the sectionally V-shaped trench 16 are defined by nonpolar planes (m-planes (10-10) or a-planes (11-20)), or semipolar planes ((10-1-1), (10-1-3), (11-22) or the like), for example.

The intrinsic GaN layer 8 may be so grown on the sapphire substrate 1 that the major surface thereof is defined by a nonpolar plane (an m-plane (10-10) or an a-plane (11-20)) or a semipolar plane ((10-1-1), (10-1-3), (11-22) or the like). In this case, it follows that the N-type AlGaN layer 9, the N-type GaN layer 5, the P-type GaN layer 6 and the N-type GaN layer 7 are stacked with major surfaces defined by the corresponding crystal planes, accordingly.

The gate insulating film 19 can be constituted of a nitride or an oxide, for example. More specifically, the quantity of charge on the interface between the gate insulating film 19 and the P-type GaN layer 6 can be reduced and carrier mobility in the channel regions 21 can be improved when constituting the gate insulating film of silicon nitride ($Si_xN_y$) or silicon oxide. In other words, channel resistance can be reduced.

The gate electrode 20 is constituted of a conductive material such as an Ni—Au alloy, an Ni—Ti—Au alloy, a Pd—Au alloy, a Pd—Ti—Au alloy, a Pd—Pt—Au alloy, Pt, Al or polysilicon.

The drain electrodes 15 are preferably constituted of a metal containing at least Al, and can be constituted of a Ti—Al alloy, for example. Thus, excellent contact with a wiring layer (not shown) can be attained. The drain electrodes 15 and the source electrodes 25 may be constituted of Mo or an Mo compound (molybdenum silicide, for example), Ti or a Ti compound (titanium silicide, for example), or W or a W compound (tungsten silicide, for example).

The operation of the aforementioned MIS field-effect transistor is now described.

A bias voltage positive on the side of the drain electrodes 15 is supplied between the source electrodes 25 and the drain electrodes 15. Thus, a reverse voltage is supplied to the P-N junction on the interface between the N-type GaN layer 5 and the P-type GaN layer 6, and the N-type GaN layers 5 and 7, i.e., the source and the drain are cut off as a result. When a prescribed voltage positive on the side of the gate electrode 20 is supplied between the source electrodes 25 and the gate electrode 20 in this state, a bias with respect to the P-type GaN layer 6 is supplied to the gate electrode 20. Thus, electrons are induced in the channel regions 21 of the P-type GaN layer 6, and inversion channels are formed. The N-type GaN layers 5 and 7 conduct through these inversion channels. Thus, it follows that the source and the drain conduct. In other words, the source and the drain conduct when a prescribed bias is supplied to the gate electrode 20, while the source and the drain are cut off when no bias is supplied to the gate electrode 20. Thus, the normally-off operation is enabled.

When the inversion channels are formed in the channel regions 21, electrons supplied from the source electrodes 25 flow into the N-type GaN layer 5 from the N-type GaN layer 7 through the channel regions 21, and head toward the drain electrodes 15 via the two-dimensional electron gas 28. The two-dimensional electron gas 28 is widely distributed on the interface between the intrinsic GaN layer 8 and the N-type AlGaN layer 9, whereby the electrons flowing into the N-type GaN layer 5 from the channel regions 21 flow into the two-dimensional electron gas 28 through a wide range of the N-type GaN layer 5. Thus, concentration of a current can be relaxed and on-resistance can be suppressed, despite the structure of extracting the drain electrodes 15 in the lateral direction of the nitride semiconductor multilayer structure portion 2.

FIGS. 2A to 2E are schematic sectional views showing a method for manufacturing the MIS field-effect transistor of FIG. 1 in step order.

First, the intrinsic GaN layer 8 is formed on the sapphire substrate 1 by epitaxial lateral overgrowth (refer to Patent Document 2). Then, the N-type AlGaN layer 9, the N-type GaN layer 5, the P-type GaN layer 6 and the N-type GaN layer 7 are successively grown on this intrinsic GaN layer 8 by epitaxy. Thus, the nitride semiconductor multilayer structure portion 2 is formed on the sapphire substrate 1 (see FIG. 2A).

Regarding the substance obtained by forming the intrinsic GaN layer 8 on the sapphire substrate 1 by epitaxial lateral overgrowth as the "substrate", it may be conceived that the "nitride semiconductor multilayer structure portion" is constituted of the group III-V nitride semiconductor layers stacked above this intrinsic GaN layer 8. Alternatively, a substance obtained by previously forming a GaN layer on a sapphire substrate (bare substrate) by epitaxial lateral overgrowth may be employed as the sapphire substrate 1, for forming the intrinsic GaN layer 8 on this sapphire substrate 1 by ordinary epitaxy. Also in this case, the intrinsic GaN layer 8 inherits dislocations from the underlayer thereof, to have the region exhibiting a high dislocation density and the regions (dislocation-free regions) exhibiting low dislocation densities.

When forming the intrinsic GaN layer 8, the intrinsic GaN layer 8 may be intentionally doped with no impurity, or the epitaxy may be performed while doping the intrinsic GaN layer 8 with Mg, C or Fe as a P-type dopant. The GaN layer is somewhat N-typed when epitaxially grown with no addition of a P-type dopant, and hence the P-type dopant is introduced in order to correct this. Mg, C or Fe may be employed also as a P-type dopant added when epitaxially growing the P-type GaN layer 6.

Si, for example, may be employed as an N-type dopant when epitaxially growing the N-type AlGaN layer 9 and the N-type GaN layers 5 and 7.

Figure 2B:
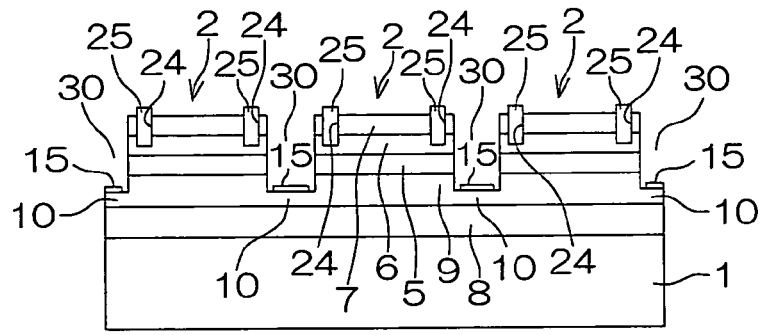

After the nitride semiconductor multilayer structure portion 2 is formed, the nitride semiconductor multilayer structure portion 2 is etched in a striped manner, as shown in FIG. 2B. In other words, sectionally rectangular grooves 30 reaching a layer-thickness intermediate portion of the N-type AlGaN layer 9 from the N-type GaN layer 7 through the P-type GaN layer 6 and the N-type GaN layer 5 are formed by etching. Thus, a plurality of nitride semiconductor multilayer structure portions 2 are shaped in a striped manner on the sapphire substrate 1, while the drawn portions 10 consisting of the extensions of the N-type GaN layer 9 are formed at the same time. Then, a pair of source electrode trenches 24 are formed along both side edges of each shaped nitride semiconductor multilayer structure portion 2 respectively. These source electrode trenches 24 are sectionally rectangular groove portions reaching the P-type GaN layer 6 from the N-type GaN layer 7, as hereinabove described.

The source electrode trenches 24 can be formed by dry etching (anisotropic etching) employing plasma, for example. Further, a wet etching treatment for improving trench inner wall surfaces damaged by the dry etching may be thereafter performed, if necessary. Thus, contact resistance of the source electrodes 25 can be reduced. An alkaline solution such as KOH (potassium hydroxide) or NH$_4$OH (ammonia water) is preferably employed for the wet etching.

After the source electrode trenches 24 are formed in this manner, the drain electrodes 15 and the source electrodes 25 are formed respectively, thereby providing the state of FIG. 2B. The drain electrodes 15 are formed to be in contact with the bottom surfaces of the grooves 30, i.e., the surfaces of the drawn portions 10 (extensions of the N-type AlGaN layer 9).

Figure 2C:
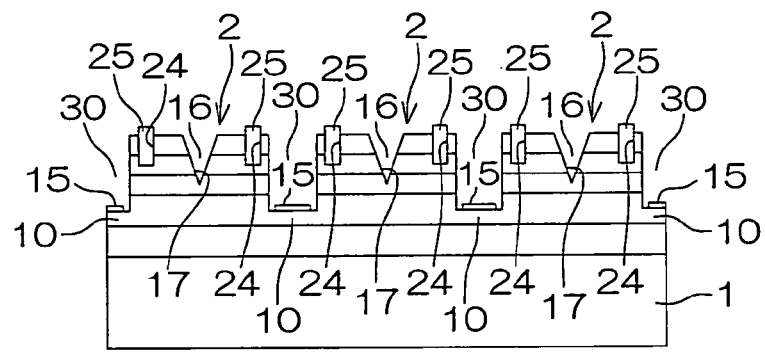

Then, the sectionally V-shaped trench 16 is formed in the vicinity of the width-directional intermediate portion of each nitride semiconductor multilayer structure portion 2 along the longitudinal direction of the nitride semiconductor multilayer structure portion 2, as shown in FIG. 2C. The position for forming the trench 16 is so set that the dislocation-free regions of the P-type GaN layer 6 are exposed from the sidewalls thereof to form the wall surfaces 17. This formation of the trench 16 includes a step of forming the V-shaped trench 16 reaching the N-type GaN layer 5 from the N-type GaN layer 7 through the P-type GaN layer 6 by dry etching (anisotropic etching) employing plasma and a wet etching step for improving the exposed surfaces damaged by the dry etching. In other words, the wet etching treatment is performed on the wall surfaces 17 damaged by the dry etching, whereby it follows that there appear new wall surfaces 17 from which damaged surface layers have been removed.

An alkaline solution such as KOH (potassium hydroxide) or NH$_4$OH (ammonia water) is preferably employed for the wet etching. Thus, less damaged wall surfaces 17 can be obtained. The damages of the wall surfaces 17 are so reduced that the crystal states of the channel regions 21 can be excellently kept and the interfaces between the wall surfaces 17 and the gate insulating film 19 can be rendered excellent, whereby the interfacial levels can be reduced. Thus, the channel resistance can be reduced, and a leakage current can be suppressed.

Figure 2D:
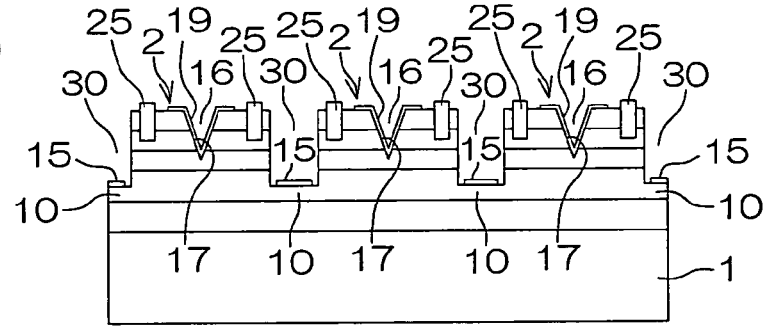

Then, the gate insulating film 19 covering the wall surfaces 17 of the V-shaped trench 16 and covering the edge portions of the trench 16 are formed, as shown in FIG. 2D. ECR (Electron Cyclotron Resonance) sputtering is preferably applied to the formation of the gate insulating film 19.

Figure 2E:
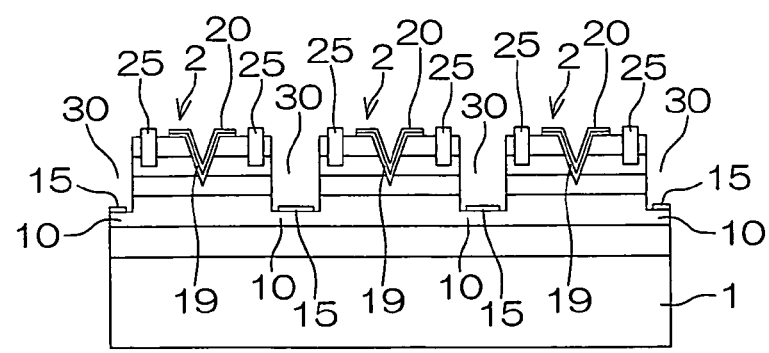

Thereafter the gate electrodes 20 are formed as shown in FIG. 2E, whereby the MIS field-effect transistor of the structure shown in FIG. 1 can be obtained.

The plurality of nitride semiconductor multilayer structure portions 2 formed on the sapphire substrate 1 in stripes form unit cells respectively. The drain electrodes 15, the gate electrodes 20 and the source electrodes 25 of the plurality of nitride semiconductor multilayer structure portions 2 are connected in common on unshown positions respectively. The drain electrodes 15 can be shared between adjacent nitride semiconductor multilayer structure portions 2.

Figure 3A:
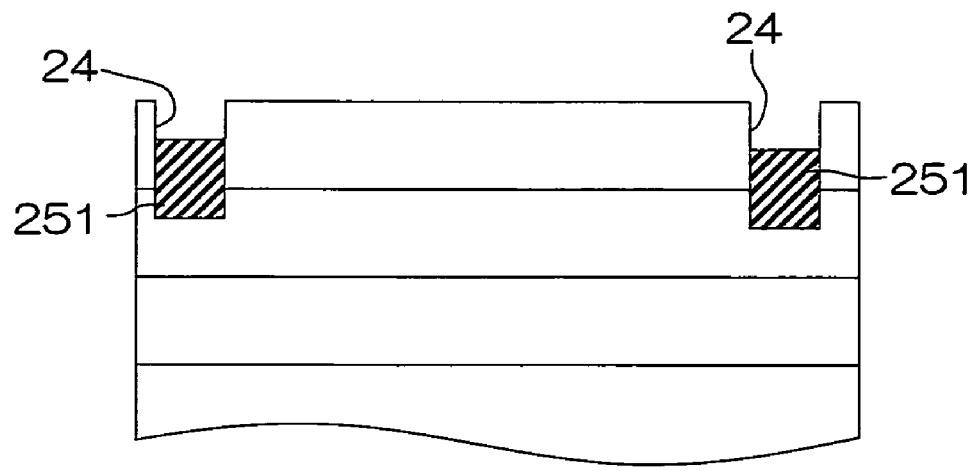
FIGS. 3A and 3B are schematic sectional views for illustrating a step of forming source electrodes.
Figure 3B:
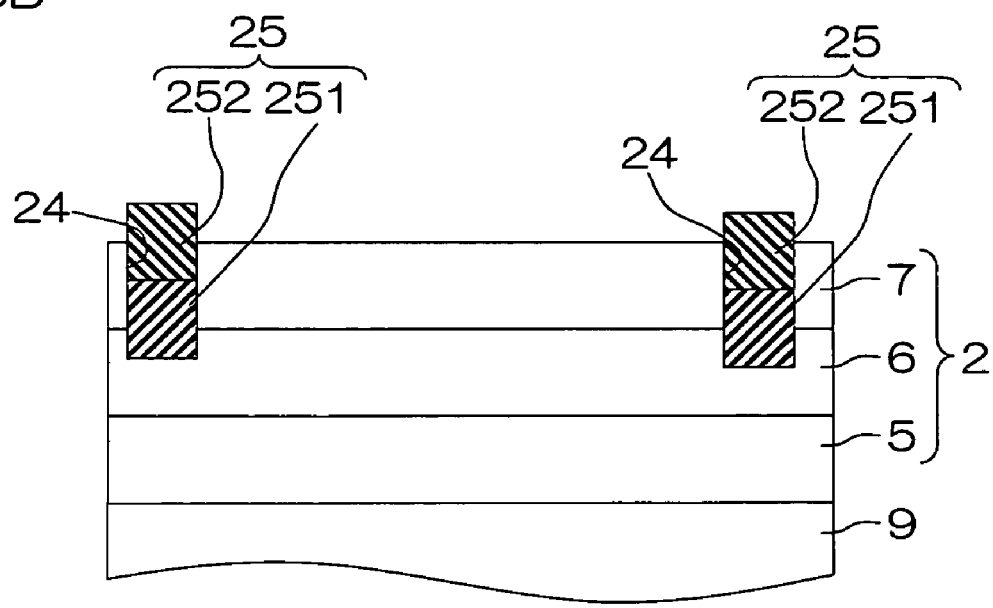

FIGS. 3A and 3B are schematic sectional views for illustrating the step of forming the source electrodes 25. First, the first electrode portions 251 are embedded in the source electrode trenches 24, as shown in FIG. 3A. In other words, the metallic material containing Pd or Ni is deposited in the source electrode trenches 24 up to a thickness exceeding the interface between the P-type GaN layer 6 and the N-type GaN layer 7 by electron beam evaporation or resistance heating deposition, for example. Thus, the first electrode portions 251 are formed.

Then, the second electrode portions 252 are embedded in the source electrode trenches 24. In other words, the metallic material containing Al is deposited to fill up the source trenches 24 up to a thickness exceeding the upper surface of the N-type GaN layer 7 by electron beam evaporation or resistance heating deposition, for example. Thus, the second electrode portions 252 are formed.

According to this embodiment, as hereinabove described, the vertical transistor structure obtained by stacking the N-type GaN layer 5, the P-type GaN layer 6 and the N-type GaN layer 7 is so employed that a field-effect transistor capable of a normally-off operation, capable of feeding a high current and having a high breakdown voltage can be implemented. Further, the intrinsic GaN layer 8 and the N-type AlGaN layer 9 are stacked on the sapphire substrate 1 and the drain electrodes 15 are formed in contact with the drawn portions 10 of the N-type AlGaN layer 9, whereby the electrons flowing into the N-type GaN layer 5 flow into the two-dimensional electron gas 28 through the wide range of this N-type GaN layer 5, and move toward the drain electrodes 15 provided on the side portions of the nitride semiconductor multilayer structure portion 2. Thus, concentration of a high current can be relaxed while employing the structure of laterally extracting the drain electrodes 15, and hence the on-resistance can be effectively reduced. Moreover, a vertical field-effect transistor can be constituted and concentration of the current can be relaxed while employing the insulating sapphire substrate 1.

The source electrodes 25 formed by the first electrode portions 251 and the second electrode portions 252 are excellently in ohmic contact with both of the P-type GaN layer 6 and the N-type GaN layer 7, whereby both of feeding of electrons to the N-type GaN layer 7 and stabilization of the potential of the P-type GaN layer 6 can be excellently attained. Thus, an excellent transistor operation can be performed.

FIG. 4 is a schematic sectional view for illustrating the structure of an MIS field-effect transistor according to a second embodiment of the present invention. Referring to FIG. 4, reference numerals identical to those in the case of FIG. 1 are allocated to portions corresponding to the portions in the above FIG. 1.

According to this embodiment, a conductive substrate 41 is employed. A nitride semiconductor multilayer structure portion 2 is formed on one surface of this conductive substrate 41. According to this embodiment, the nitride semiconductor multilayer structure portion 2 is constituted of an N-type GaN layer 5 formed on the surface of the conductive substrate 41, a P-type GaN layer 6 stacked thereon, and an N-type GaN layer 7 stacked thereon. A drain electrode 15 is formed in contact with the other surface of the conductive substrate 41. In this embodiment, therefore, it follows that the drain electrode 15 is electrically connected to the N-type GaN layer 5 through the conductive substrate 41. The remaining structure is similar to that in the case of the aforementioned first embodiment, and the operation is also similar.

The conductive substrate 41 is in contact with the N-type GaN layer 5 along the overall region of the surface thereof, whereby electrons fed to the N-type GaN layer 5 through channel regions 21 head toward the conductive substrate 41 through a wide range of this N-type GaN layer 5, and flow into the drain electrode 15 through this conductive substrate 41. Thus, current concentration can be suppressed.

A ZnO substrate, an Si substrate, a GaAs substrate, a GaN substrate or an SiC substrate can be applied as the conductive substrate 41. In particular, the GaN substrate is most preferably employed. The GaN substrate is so employed as the conductive substrate 41 that the lattice constants of the same and the N-type GaN layer 5 formed on the surface thereof can be matched with each other. Therefore, the nitride semiconductor multilayer structure portion 2 having a small number of lattice defects can be obtained by employing the GaN substrate as the conductive substrate 41 and successively epitaxially growing the N-type GaN layer 5, the P-type GaN layer 6 and the N-type GaN layer 7 on the surface of this conductive substrate 41.

When employing the conductive substrate 41 whose major surface is defined by a C-plane (0001), it follows that the N-type GaN layer 5, the P-type GaN layer 6 and the N-type GaN layer 7 stacked on this conductive substrate 41 by epitaxy are stacked also with major surfaces defined by C-planes (0001). Wall surfaces 17 of a sectionally V-shaped trench 16 are defined by nonpolar planes (m-planes (10-10) or a-planes (11-20)) or semipolar planes ((10-1-1), (10-1-3), (11-22) or the like), for example.

A substrate whose major surface is defined by a nonpolar plane (an m-plane (10-10) or an a-plane (11-20)) or a semipolar plane ((10-1-1), (10-1-3), (11-22) or the like) may be employed as the conductive substrate 41. In this case, it follows that the N-type GaN layer 5, the P-type GaN layer 6 and the N-type GaN layer 7 are stacked with major surfaces defined by the corresponding crystal planes, accordingly.

FIGS. 5A to 5E are schematic sectional views showing a method for manufacturing the field-effect transistor of FIG. 4 in step order. The N-type GaN layer 5, the P-type GaN layer 6 and the N-type GaN layer 7 are successively epitaxially grown on the conductive substrate 41, whereby the nitride semiconductor multilayer structure portion 2 is formed (see FIG. 5A).

Figure 5A:
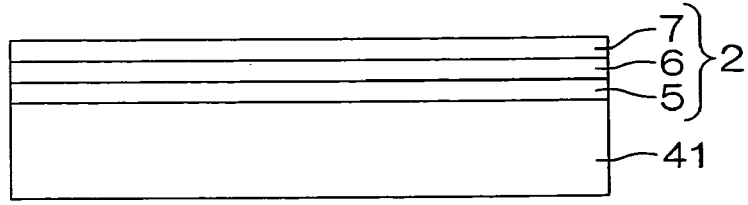
FIGS. 5A to 5E are schematic sectional views showing a method for manufacturing the MIS field-effect transistor of FIG. 4 in step order.
Figure 5B:
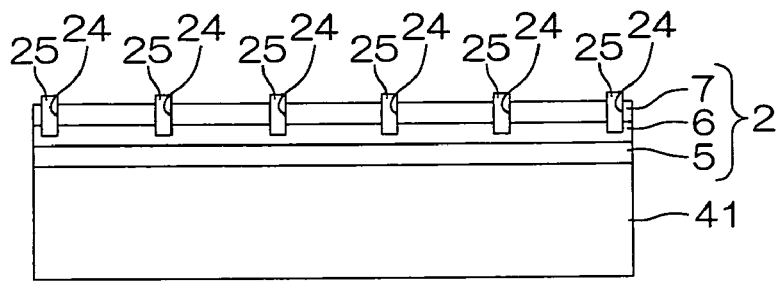

Then, sectionally rectangular source electrode trenches 24 are formed in a striped manner with respect to the nitride semiconductor multilayer structure portion 2, and source electrodes 25 are embedded in the source electrode trenches 42 (FIG. 5B). The field-effect transistor according to this embodiment has a structure of extracting the drain electrode 15 from the lower surface side (opposite to the nitride semiconductor multilayer structure portion 2) of the conductive substrate 41, whereby the nitride semiconductor multilayer structure portion 2 may not be divided into a plurality of portions but can be employed in a state integrated on the conductive substrate 41.

Figure 5C:
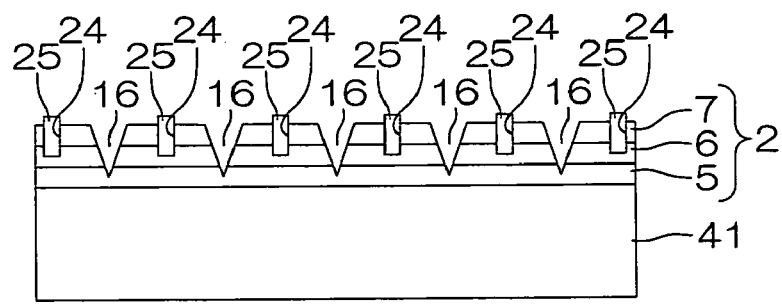
Figure 5D:
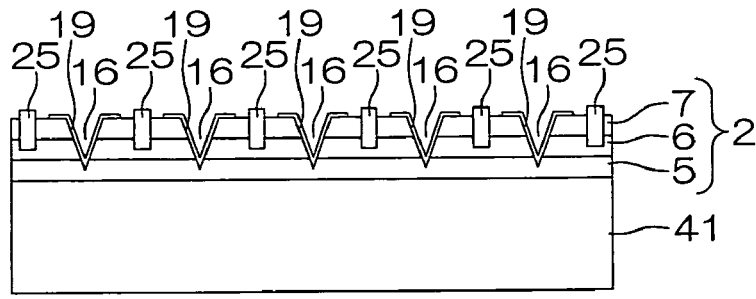
Figure 5E:
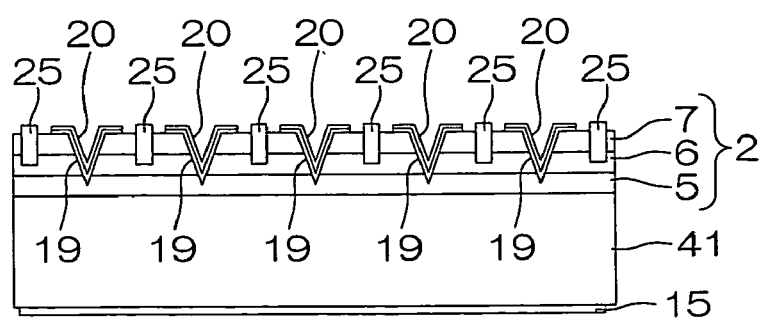

Then, the sectionally V-shaped trench 16 is formed around an intermediate portion between each adjacent pair of source electrode trenches 24 by dry etching similarly to the case of the first embodiment, and damaged layers of the wall surfaces 17 are further removed by wet etching (see FIG. 5C). After a gate insulating film 19 covering the wall surfaces 17 of the trench 16 is formed as shown in FIG. 5D, the drain electrode 15 and a gate electrode 20 are formed, as shown in FIG. 5E. The method for forming the source electrodes 25 is similar to that in the case of the first embodiment. The drain electrode 15 is formed to be in contact with the lower surface of the conductive substrate 41 in this case.

Thus, a field-effect transistor having a plurality of cells can be prepared with unit cells formed by the portions of the individual trenches 16. Each adjacent pair of cells share a source electrode 25 arranged therebetween. The gate electrodes 20 and the source electrodes 25 of the plurality of cells are connected in common on unshown positions respectively, similarly to the case of the aforementioned first embodiment. The drain electrode 15, formed in contact with the conductive substrate 41, is an electrode common to all cells.

Figure 6:
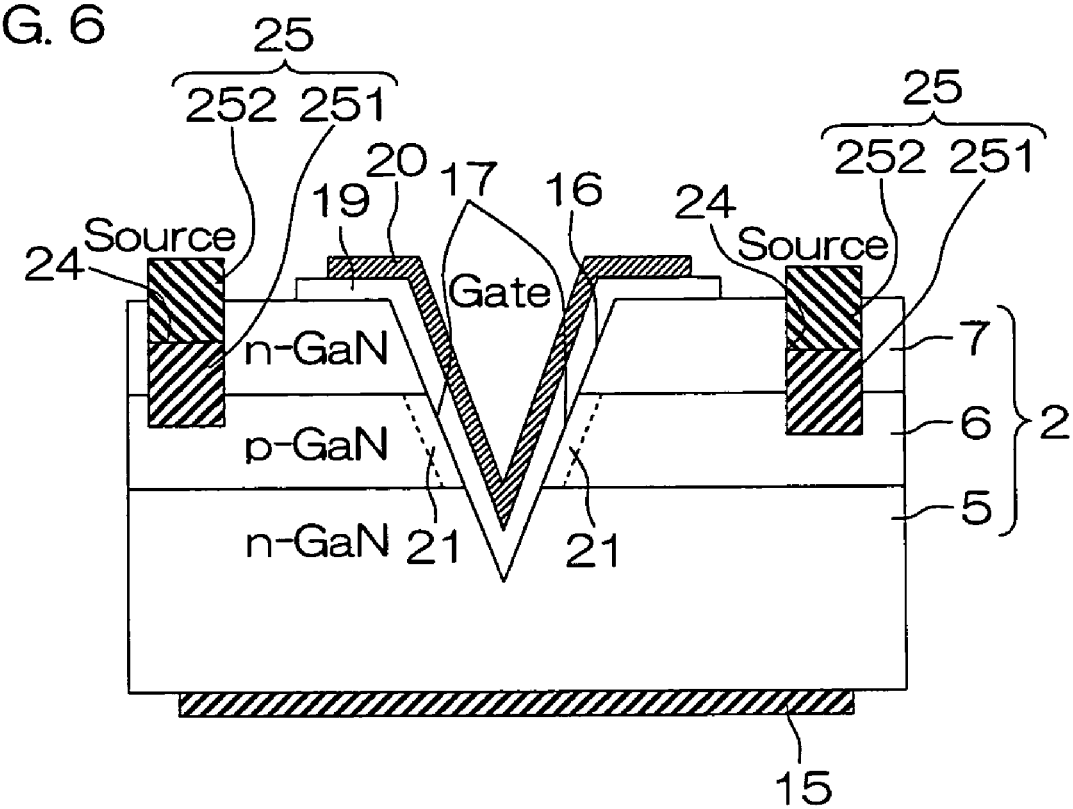
[FIG. 6] A schematic sectional view for illustrating the structure of an MIS field-effect transistor according to a third embodiment of the present invention.

FIG. 6 is a schematic sectional view for illustrating the structure of an MIS field-effect transistor according to a third embodiment of the present invention. Referring to FIG. 6, the same reference numerals are allocated to portions corresponding to the respective portions shown in the above FIG. 4. According to this embodiment, no substrate is provided, while a drain electrode 15 is formed in contact with a surface opposite to a gate electrode 20 in a nitride semiconductor multilayer structure portion 2. More specifically, the drain electrode 15 is applied/formed to generally cover the overall region of the lower surface (surface opposite to the gate electrode 20) of an N-type GaN layer 5. Therefore, this field-effect transistor can be formed in an extremely small thickness, and the thickness of the overall device reaching the upper surface(s) of the gate electrode 20 or source electrodes 25 from the drain electrode 15 can be set to not more than 30 μm. Further, electrons flowing into the N-type GaN layer 5 diffuses and flows in a wide range of this N-type GaN layer 5, to flow into the drain electrode 15. Therefore, concentration of a current can be suppressed.

FIGS. 7A to 7F are schematic sectional views showing a method for manufacturing the field-effect transistor of FIG. 6 in step order. The N-type GaN layer 5, a P-type GaN layer 6 and an N-type GaN layer 7 are successively epitaxially grown on a substrate 45, whereby the nitride semiconductor multilayer structure portion 2 is formed (see FIG. 7A).

A sapphire substrate, a ZnO substrate, an Si substrate, a GaAs substrate, a GaN substrate or an SiC substrate can be applied as the substrate 45. Employment of the GaN substrate is most preferable in view of the matching property of the lattice constant with the nitride semiconductor layers. However, a GaN epitaxial growth layer may be formed on a sapphire substrate, for example, by epitaxial lateral overgrowth so that this is employed as the substrate 45 and the N-type GaN layer 5, the P-type GaN layer 6 and the N-type GaN layer 7 are successively epitaxially grown on the GaN epitaxial growth layer.

When employing the substrate 45 whose major surface is defined by a C-plane (0001), it follows that the N-type GaN layer 5, the P-type GaN layer 6 and the N-type GaN layer 7 stacked on this substrate 45 by epitaxy are stacked with major surfaces defined by C-planes (0001). Further, wall surfaces 17 of a sectionally V-shaped trench 16 formed later are defined by nonpolar planes (m-planes (10-10) or a-planes (11-20)) or semipolar planes ((10-1-1), (10-1-3), (11-22) or the like), for example. A substrate whose major surface is defined by a nonpolar plane (an m-plane (10-10) or an a-plane (11-20)) or a semipolar plane ((10-1-1), (10-1-3), (11-22) or the like) may be employed as the substrate 45. In this case, it follows that the N-type GaN layer 5, the P-type GaN layer 6 and the N-type GaN layer 7 are stacked with major surfaces defined by the corresponding crystal planes, accordingly.

Figure 7A:
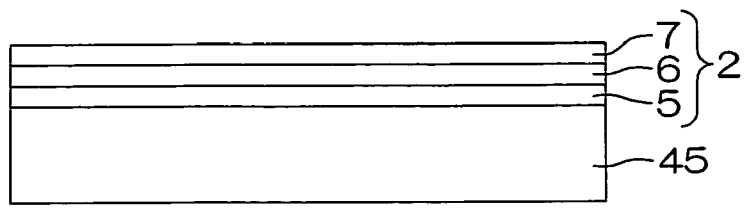
FIGS. 7A to 7F are schematic sectional views showing a method for manufacturing the MIS field-effect transistor of FIG. 6 in step order.
Figure 7B:
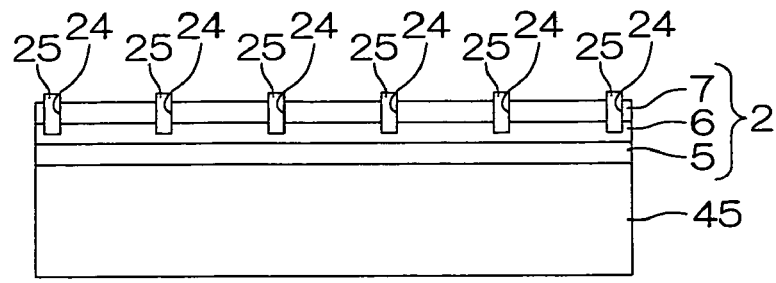

Then, sectionally rectangular source electrode trenches 24 are formed in a striped manner with respect to the nitride semiconductor structure portion 2, and the source electrodes 25 are embedded in these source electrode trenches 24 (FIG. 7B). The field-effect transistor according to this embodiment has a structure of extracting the drain electrode 15 from the lower surface side (opposite to the gate electrode 20) of the nitride semiconductor multilayer structure portion 2, whereby the nitride semiconductor multilayer structure portion 2 may not be divided into a plurality of portions.

Figure 7C:
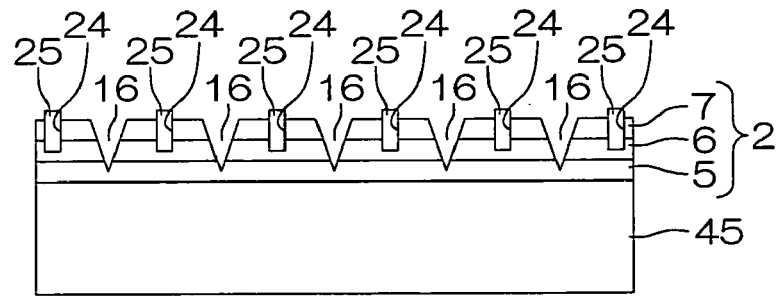
Figure 7D:
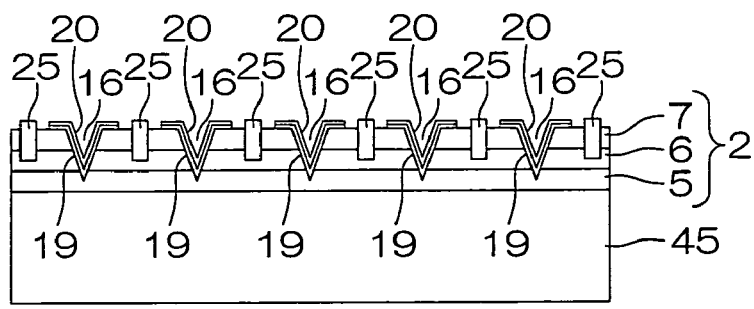

Then, the sectionally V-shaped trench 16 is formed around an intermediate portion between each adjacent pair of source electrode trenches 24 by dry etching similarly to the case of the first embodiment, and damaged layers of the wall surfaces 17 are further removed by wet etching (see FIG. 7C). In addition, a gate insulating film 19 covering the wall surfaces 17 of the trench 16 is formed as shown in FIG. 7D, and the gate electrode 20 is formed to cover this.

Figure 7E:
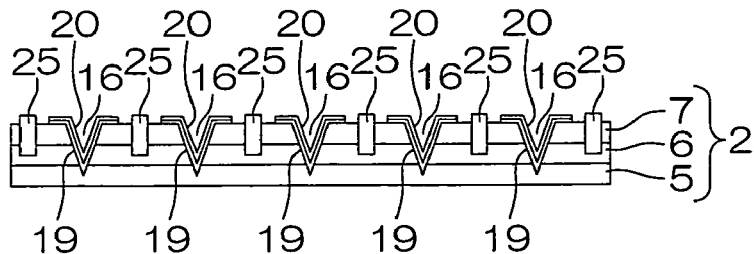

Then, the substrate 45 is removed, as shown in FIG. 7E. The removal of the substrate 45 can be performed by a laser lift-off method of applying a laser beam from the surface of the substrate 45 and separating the substrate 45, or can be performed also by a CMP (chemical mechanical polishing) treatment or an etching treatment.

Figure 7F:
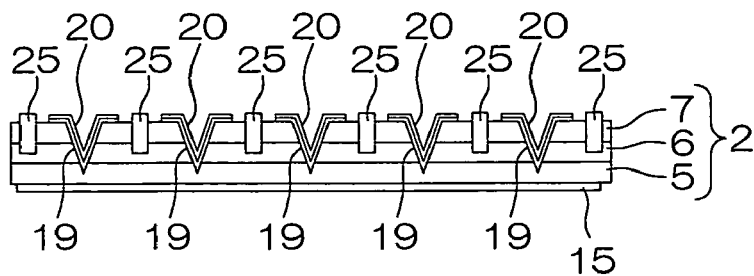

Thereafter the drain electrode 15 is formed, as shown in FIG. 7F. The method for forming the source electrodes 25 is similar to that in the case of the aforementioned first embodiment. The drain electrode 15 is formed in contact with the N-type GaN layer 5 in this case.

Thus, a field-effect transistor having a plurality of cells can be prepared with unit cells formed by the portions of the individual trenches 16. Each adjacent pair of cells share the source electrode 25 arranged therebetween, similarly to the case of the aforementioned second embodiment. The gate electrodes 20 and the source electrodes 25 of the plurality of cells are connected in common on unshown positions respectively. The drain electrode 15, formed in contact with the N-type GaN layer 5, is an electrode common to all cells.

FIG. 8 is a schematic sectional view for illustrating the structure of an MIS field-effect transistor according to a fourth embodiment of the present invention. Referring to FIG. 8, reference numerals identical to those in the case of FIG. 4 are allocated to portions corresponding to the respective portions shown in the above FIG. 4. According to this embodiment, a gate insulating film 50 is formed by an AlGaN regrowth layer 51 regrown (epitaxially grown) from wall surfaces 17 of a trench 16 and an insulating film 52 stacked and formed on the surface of this AlGaN regrowth layer 51. This gate insulating film 50 is formed over a region covering the wall surfaces 17 of the trench 16 and reaching edge portions of the trench 16 on the upper surface of an N-type GaN layer 7, similarly to the gate insulating film 19 in the aforementioned embodiment.

The AlGaN regrowth layer 51 is epitaxially grown from the wall surfaces 17 which are GaN crystal surfaces after forming the trench 16 by dry etching and shaping the wall surfaces 17 by a wet etching treatment. The aluminum composition of this AlGaN regrowth layer 51 is set to not less than 50% and less than 10%. The AlGaN regrowth layer 51 preferably contains no In. Further, the wall surfaces 17 on which the AlGaN regrowth layer 51 is formed are preferably defined by nonpolar planes (m-planes (10-10) or a-planes (11-20)), or semipolar planes ((10-1-1), (10-1-3), (11-22) or the like).

The insulating film 52 stacked on the AlGaN regrowth layer 51 can be prepared from a nitride or an oxide, for example. This insulating film 52 improves the insulating property of the gate insulating film 50 as a while, thereby contributing to suppression of a gate leakage current. If the insulating property of the AlGaN regrowth layer 51 is sufficient, the insulating film 52 may be omitted.

According to the structure of this embodiment, the interfaces between the gate insulating film 50 and the wall surfaces 17 are bonded surfaces between GaN crystals and an AlGaN crystal, and hence the same are stable interfaces, whereby the quantity of interfacial charge can be reduced. Thus, mobility in channel regions 25 can be improved and a leakage current can be suppressed, whereby the reliability of the device can be improved as a result.

FIGS. 9A to 9F are schematic sectional views showing a method for manufacturing the field-effect transistor of FIG. 8 in step order. An N-type GaN layer 5, a P-type GaN layer 6 and the N-type GaN layer 7 are successively epitaxially grown on a conductive substrate 41, whereby a nitride semiconductor multilayer structure portion 2 is formed (see FIG. 9A).

Then, sectionally V-shaped trenches 16 are formed in a striped manner by dry etching with respect to the nitride semiconductor multilayer structure portion 2, and damaged layers of the wall surfaces 17 are further removed by wet etching (see FIG. 9B). Then, the AlGaN regrowth layer 51 is formed by epitaxy from the wall surfaces 17 of each trench 16, as shown in FIG. 9C. This AlGaN regrowth layer 51 is an intrinsic semiconductor layer, and grown to a layer thickness of about 1000 Å, for example.

Thereafter sectionally rectangular source electrode trenches 24 are formed around intermediate portions between adjacent V-shaped trenches 16 in a striped manner, and source electrodes 25 are formed to embed these, as shown in FIG. 9D. The method for forming the source electrodes 25 is similar to that in the case of the aforementioned first embodiment.

Thereafter the insulating film 52 is stacked on the AlGaN regrowth layer 51, as shown in FIG. 9E.

After the gate insulating film 50 is formed in this manner, a gate electrode 20 is formed. Thereafter a drain electrode 15 is formed, as shown in FIG. 9F. The drain electrode 15 is formed to be in contact with the lower surface of the conductive substrate 41.

Thus, a field-effect transistor having a plurality of cells can be prepared with unit cells formed by the portions of the individual trenches 16. The gate electrodes 20 and the source electrodes 25 of the plurality of cells are connected in common on unshown positions respectively. The drain electrode 15, formed in contact with the conductive substrate 41, is an electrode common to all cells.

FIG. 10 is a schematic sectional view for illustrating the structure of an MIS field-effect transistor according to a fifth embodiment of the present invention. Referring to FIG. 10, reference numerals identical to those in the case of FIG. 4 are allocated to portions corresponding to the respective portions shown in the above FIG. 4. According to this embodiment, an N-type AlGaN layer 55 is applied in place of the N-type GaN layer 5 in the aforementioned embodiment, and an N-type AlGaN layer 57 is further employed in place of the N-type GaN layer 7. In other words, the N-type AlGaN layer 55 is formed on the surface of a conductive substrate 41 by epitaxy, a P-type GaN layer 6 is further formed on the N-type AlGaN layer 55 similarly by epitaxy, and the N-type AlGaN layer 57 is formed on the surface of the P-type GaN layer 6 also by epitaxy.

A trench 16 is formed in a depth reaching the N-type AlGaN layer 55 from the N-type AlGaN layer 57 through the P-type GaN layer 6, and formed in a sectionally V-shaped manner in this embodiment. A gate insulating film 19 and a gate electrode 20 are stacked/formed on wall surfaces 17 of this trench 16, similarly to the case of the aforementioned third embodiment.

Source electrode trenches 24 reaching the P-type GaN layer 6 from the N-type AlGaN layer 57 are formed on positions different from the trench 16. Source electrodes 25 are embedded in these source electrode trenches 24. Therefore, the source electrodes 25 are in contact with the N-type AlGaN layer 57 forming a source layer and also in contact with the P-type GaN layer 6, to fix the potential of this P-type GaN layer 6 equally to the potential of the N-type AlGaN layer 57 as the source layer.

Thus, a double heterostructure sandwiching the P-type GaN layer 6 with the N-type AlGaN layers 55 and 57 is formed. The band gaps of the AlGaN layers 55 and 57 are wider than the band gap of the GaN layer 6, whereby only the band gap of the P-type GaN layer 6 constituting channel regions 21 is small. Thus, the breakdown voltage of the device can be further improved.

The source electrodes 25 are constituted by bonding first electrode portions 251 embedded in the bottom portions of the source electrode trenches 24 and second electrode portions 252 embedded on these first electrode portions 251 to one another, similarly to the case of the aforementioned first embodiment. According to this embodiment, the first electrode portions 251 are embedded up to the height of a layer-thickness intermediate portion of the N-type AlGaN layer 57 from the bottom surfaces of the source electrode trenches 24 beyond the interface between the P-type GaN layer 6 and the N-type AlGaN layer 57, and in ohmic contact with the P-type GaN layer 6 on the inner wall surfaces (bottom surfaces and sidewalls) of the source electrode trenches 24. According to this embodiment, the second electrode portions 252 fill up the source trenches 24 from the layer-thickness intermediate portion of the N-type AlGaN layer 57, and are provided n a state protruding beyond the upper surface of the N-type AlGaN layer 57. The second electrode portions 252 are in ohmic contact with the N-type AlGaN layer 57 on the inner wall surfaces (sidewalls) of the source electrode trenches 24. Further, the top faces of the first electrode portions 251 and the bottom surfaces of the second electrode portions 252 are bonded to one another, whereby the first and second electrode portions 251 are integrated, and electrically connected with one another.

The first electrode portions 251 in ohmic contact with the P-type GaN layer 6 are constituted of a metallic material containing Pd or Ni. More specifically, the first electrode portions 251 can be constituted of a Pd—Au alloy, a Pd—Ti—Au alloy, a Pd—Pt—Au alloy, an Ni—Au alloy or the like. The second electrode portions 252 in ohmic contact with the N-type AlGaN layer 57 are constituted of a metallic material containing Al. More specifically, the second electrode portions 252 can be constituted of an Al metal, or can be constituted of an Al alloy such as a Ti—Al alloy or the like.

This field-effect transistor can be prepared by a method similar to the method described with reference to FIGS. 5A to 5E. In other words, the N-type AlGaN layer 55 may be epitaxially grown on the surface of the conductive substrate 41 in place of the N-type GaN layer 5, and the N-type AlGaN layer 57 may be epitaxially grown on the P-type GaN layer 6 in place of the N-type GaN layer 7.

When employing the conductive substrate 41 whose major surface is defined by a C-plane (0001), it follows that the N-type AlGaN layer 55, the P-type GaN layer 6 and the N-type AlGaN layer 57 stacked on this conductive substrate 41 by epitaxy are stacked also with major surfaces defined by C-planes (0001). Further, the wall surfaces 17 of the sectionally V-shaped trench 16 are defined by nonpolar planes (m-planes (10-10) or a-planes (11-20)) or semipolar planes ((10-1-1), (10-1-3), (11-22) or the like), for example.

A substrate whose major surface is defined by a nonpolar plane (an m-plane (10-10) or an a-plane (11-20)) or a semipolar plane ((10-1-1), (10-1-3), (11-22) or the like) may be employed as the conductive substrate 41. In this case, it follows that the N-type AlGaN layer 55, the P-type GaN layer 6 and the N-type AlGaN layer 57 are stacked with major surfaces defined by the corresponding crystal planes, accordingly.

While the five embodiments of the present invention have been described, the present invention may be embodied in other ways. For example, the structure of the gate insulating film 50 shown in FIG. 8 can be replaced with the gate insulating film 19 according to the first embodiment (FIG. 1), the third embodiment (FIG. 6) and the fifth embodiment (FIG. 10). Further, the multilayer structure of the N-type AlGaN layer 55, the P-type GaN layer 6 and the N-type AlGaN layer 57 shown in the fifth embodiment (FIG. 10) can be employed also in the first embodiment (FIG. 1) and the third embodiment (FIG. 6). While the N-type AlGaN layers 55 and 57 are arranged on both sides of the P-type GaN layer 6 in the fifth embodiment (FIG. 10), the breakdown voltage of the device can be improved also by forming only a layer stacked on one side of the P-type GaN layer 6 by an N-type AlGaN layer. In other words, the N-type GaN layer 5 may be applied without employing the N-type AlGaN layer 55, or the N-type GaN layer 7 may be applied without employing the N-type AlGaN layer 57 in the structure of FIG. 10.

Further, while such an example that the sectionally V-shaped trench 16 is formed on the nitride semiconductor multilayer structure portion 2 has been described in the aforementioned embodiments, the shape of the trench 16 may be another shape such as an inverted trapezoidal shape, a U-shape, a rectangular shape or a trapezoidal shape. In addition, the wall surfaces 17 may not be inclined surfaces inclined with respect to the substrate, and may not be planes either. In other words, the wall surfaces 17 may be planes perpendicular to the substrate, or may be curved surfaces.

While the gate insulating film 19 and the gate electrode 20 are stacked and formed on both of the pair of wall surfaces 17 of the trench 16 in the aforementioned embodiment, the multilayer structure of these may be formed only on one wall surface 17. Further, the nitride semiconductor multilayer structure portion 2 may be etched on a position shown by a two-dot chain line 60 in FIG. 4, so that the device is formed by employing only either side of this two-dot chain line 60, for example. In this case, it follows that the wall surfaces 17 extending over the N-type GaN layer 5, the P-type GaN layer 6 and the N-type GaN layer 7 are formed although no sectionally V-shaped trench is formed on the nitride semiconductor multilayer structure portion 2.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-228029 filed in the Japanese Patent Office on Aug. 24, 2006, the entire disclosure of which is incorporated herein by reference.

The invention claimed is:

1. An MIS field-effect transistor, comprising:
   a nitride semiconductor multilayer structure portion including a first group III-V nitride semiconductor layer of a first conductivity type, a second group III-V nitride semiconductor layer of a second conductivity type stacked on the first group III-V nitride semiconductor layer and a third group III-V nitride semiconductor layer of the first conductivity type stacked on the second group III-V nitride semiconductor layer;
   a gate insulating film formed on a wall surface formed over the first, second and third group III-V nitride semiconductor layers to extend over the first, second and third group III-V nitride semiconductor layers;
   a gate electrode made of a conductive material formed as being opposed to the second group III-V nitride semiconductor layer with the gate insulating film interposed therebetween;
   a drain electrode electrically connected to the first group III-V nitride semiconductor layer; and
   a source electrode provided as being in contact with both of the second group III-V nitride semiconductor layer and the third group III-V nitride semiconductor layer, wherein
   the source electrode includes a first electrode portion made of a first conductive material, and a second electrode portion, made of a second conductive material different from the first conductive material, bonded to the first electrode portion, the first electrode portion is in contact with the second group III-V nitride semiconductor layer, the second electrode portion is in contact with the third group III-V nitride semiconductor layer,
   a source electrode trench reaching the second group III-V nitride semiconductor layer from the third group III-V nitride semiconductor layer is formed,
   the source electrode trench has a bottom surface and a sidewall extending over the second and third group III-V nitride semiconductor layers,
   the source electrode is embedded in the source electrode trench,
   the first electrode portion is embedded in the source electrode trench such that the first electrode portion is in contact with the second group III-V nitride semiconductor layer on the bottom surface and the sidewall,
   the second electrode portion is embedded in the source electrode trench to fill up the source electrode trench such that the second electrode portion is in contact with the third group III-V nitride semiconductor layer on the sidewall, and
   the first electrode portion is embedded in the source electrode trench from the bottom surface up to a height of a layer thickness intermediate portion of the third group III-V nitride semiconductor layer beyond an interface between the second group III-V nitride semiconductor layer and the third group III-V nitride semiconductor layer.

2. The MIS field-effect transistor according to claim 1, wherein
   the second conductivity type is a P-type, and the first conductive material constituting the first electrode portion is a metallic material containing Pd or Ni.

3. The MIS field-effect transistor according to claim 1, wherein
   the first conductivity type is an N-type, and the second conductive material constituting the second electrode portion is a metallic material containing Al.

4. The MIS field-effect transistor according to claim 1, wherein
   a trench reaching the first group nitride semiconductor layer from the third group III-V nitride semiconductor layer through the second group III-V nitride semiconductor layer is formed, and a sidewall of the trench forms the wall surface.

5. The MIS field-effect transistor according to claim 1, wherein
   the nitride semiconductor multilayer structure portion further includes a fourth group III-V nitride semiconductor layer of the first conductivity type arranged on a side opposite to the second group III-V nitride semiconductor layer with respect to the first group III-V nitride semiconductor layer, and
   the drain electrode is connected to the fourth group III-V nitride semiconductor layer.

6. The MIS field-effect transistor according to claim 1, wherein
   the nitride semiconductor multilayer structure portion is formed on a substrate.

7. The MIS field-effect transistor according to claim 6, wherein
   the substrate is an insulating substrate.

8. The MIS field-effect transistor according to claim 6, wherein
   the substrate is an $Al_2O_3$ substrate, a ZnO substrate, an Si substrate, a GaAs substrate, a GaN substrate or an SiC substrate.

9. The MIS field-effect transistor according to claim 6, wherein
   the substrate is a substrate having a region exhibiting a high dislocation density and a region exhibiting a small dislocation density in a horizontal direction, and the gate electrode is arranged as being opposed to a region grown from the region exhibiting a low dislocation density.

10. The MIS field-effect transistor according to claim 1, wherein
the nitride semiconductor multilayer structure portion is arranged on one surface of a conductive substrate, and
the drain electrode is connected to the other surface of the conductive substrate.

11. The MIS field-effect transistor according to claim 1, wherein
the drain electrode is connected to the first group III-V nitride semiconductor layer.

12. The MIS field-effect transistor according to claim 1, wherein
the drain electrode is formed in contact with a surface of the nitride semiconductor multilayer structure portion opposite to the gate electrode.

13. The MIS field-effect transistor according to claim 1, wherein
the first, second and third group III-V nitride semiconductor layers are stacked with major surfaces defined by C-planes.

14. The MIS field-effect transistor according to claim 1, wherein
the first, second and third group III-V nitride semiconductor layers are stacked with major surfaces defined by nonpolar planes or semipolar planes.

15. The MIS field-effect transistor according to claim 1, wherein
the wall surface of the first, second and third group III-V nitride semiconductor layers on which the gate insulating film is formed is defined by a nonpolar plane or a semipolar plane.

16. The MIS field-effect transistor according to claim 1, wherein
the gate insulating film is a nitride or an oxide.

17. The MIS field-effect transistor according to claim 1, wherein
the gate insulating film is made of silicon nitride or silicon oxide.

18. The MIS field-effect transistor according to claim 1, wherein
the conductive material constituting the gate electrode is made of a simple metal or an alloy containing at least any one of Al, Au and Pt.

19. The MIS field-effect transistor according to claim 1, wherein
the conductive material constituting the gate electrode contains polysilicon.

20. The MIS field-effect transistor according to claim 1, wherein
the material constituting the source electrode or the drain electrode contains Mo or an Mo compound, Ti or a Ti compound, or W or a W compound.

21. The MIS field effect transistor according to claim 1, wherein the second electrode portion protrudes beyond an upper surface of the third III-V nitride semiconductor layer.

22. A semiconductor device comprising:
a P-type group III-V nitride semiconductor layer;
an N-type group III-V nitride semiconductor layer; and
an electrode in contact with both of the P-type group III-V nitride semiconductor layer and the N-type group III-V nitride semiconductor layer, wherein
the electrode includes a first electrode portion made of a first conductive material, and a second electrode portion, made of a second conductive material different from the first conductive material, bonded to the first electrode portion, the first electrode portion is in contact with the P-type group III-V nitride semiconductor layer,
the second electrode portion is in contact with the N-type group III-V nitride semiconductor layer,
the P-type group III-V nitride semiconductor layer and the N-type group III-V nitride semiconductor layer are stacked,
a trench having a bottom surface and a sidewall extending over the P-type group III-V nitride semiconductor layer and the N-type group III-V nitride semiconductor layer is formed,
the electrode is embedded in the trench,
the first electrode portion is embedded in the trench such that the first electrode portion is in contact with the P-type group III-V nitride semiconductor layer on the bottom surface and the sidewall,
the second electrode portion is embedded in the trench to fill up the trench such that the second electrode portion is in contact with the N-type group III-V nitride semiconductor layer on the sidewall, and
the first electrode portion is embedded in the trench from the bottom surface up to a height of a layer thickness intermediate portion of the N-type group III-V nitride semiconductor layer beyond an interface between the P-type group III-V nitride semiconductor layer and the N-type group III-V nitride semiconductor layer.

23. The semiconductor device according to claim 22, wherein
the first conductive material constituting the first electrode portion is a metallic material containing Pd or Ni.

24. The semiconductor device according to claim 22, wherein
the second conductive material constituting the second electrode portion is a metallic material containing Al.

25. The semiconductor device according to claim 22, wherein the second electrode portion protrudes beyond an upper surface of the N-type III-V nitride semiconductor layer.

* * * * *